US012763491B2

(12) United States Patent
Chiu et al.

(10) Patent No.: US 12,763,491 B2
(45) Date of Patent: Oct. 13, 2026

(54) PHASE-ARRAY ANTENNA

(71) Applicant: InnoLux Corporation, Miao-Li County (TW)

(72) Inventors: Liang-Yun Chiu, Miao-Li County (TW); Tsung-Han Tsai, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 133 days.

(21) Appl. No.: 18/804,450

(22) Filed: Aug. 14, 2024

(65) Prior Publication Data

US 2024/0405445 A1 Dec. 5, 2024

Related U.S. Application Data

(63) Continuation of application No. 18/337,483, filed on Jun. 20, 2023, now Pat. No. 12,088,011, which is a continuation of application No. 17/813,642, filed on Jul. 20, 2022, now Pat. No. 11,721,911, which is a continuation of application No. 16/920,458, filed on Jul. 3, 2020, now Pat. No. 11,424,552.

(30) Foreign Application Priority Data

Jul. 5, 2019 (CN) ......................... 201910603673.9

(51) Int. Cl.

| | |
|---|---|
| ***H01Q 7/00*** | (2006.01) |
| ***H01Q 1/36*** | (2006.01) |
| ***H01Q 21/06*** | (2006.01) |
| ***H10D 86/40*** | (2025.01) |
| ***H10D 86/60*** | (2025.01) |

(52) U.S. Cl.

CPC ............. *H01Q 21/061* (2013.01); *H01Q 1/36* (2013.01); *H01Q 7/00* (2013.01); *H10D 86/481* (2025.01); *H10D 86/60* (2025.01)

(58) Field of Classification Search

CPC .......... H01Q 21/061; H01Q 7/00; H01Q 1/36; H01L 27/255

USPC .......................................................... 343/867

See application file for complete search history.

(56) References Cited

U.S. PATENT DOCUMENTS

2015/0029064 A1* 1/2015 Pan .......................... H01Q 1/22 343/769
2015/0333408 A1* 11/2015 Ohno ....................... H01Q 1/38 343/819
2017/0176800 A1* 6/2017 Chen .................. G02F 1/13363
2020/0099115 A1* 3/2020 Sun ......................... H01P 1/184

* cited by examiner

*Primary Examiner* — Peguy Jean Pierre
(74) *Attorney, Agent, or Firm* — McClure, Qualey & Rodack, LLP

(57) ABSTRACT

A phase-array antenna is provided. The phase-array antenna includes a plurality of antenna units arranged in an array. One of the plurality antenna units includes a substrate, a feeding line, a conductor and an active element. The feeding line is disposed on the substrate and has a signal transmitting end. The conductor is disposed on the substrate and has a signal receiving end. The active element is disposed on the substrate and includes an active layer. The signal transmitting end of the feeding line is apart from the signal receiving end of the conductor by 0.05 mm to 5 mm, and the active layer is apart from the feeding line by 1 mm to 200 mm.

9 Claims, 15 Drawing Sheets

PHASE-ARRAY ANTENNA

CROSS REFERENCE TO RELATED APPLICATIONS

This application is a Continuation of pending U.S. patent application Ser. No. 18/337,483, filed Jun. 20, 2023 and entitled "Electronic Device", now U.S. Pat. No. 12,088,011, which is a Continuation of pending U.S. patent application Ser. No. 17/813,642, filed Jul. 20, 2022 and entitled "Electronic Device", now U.S. Pat. No. 11,721,911, which is a Continuation of pending U.S. patent application Ser. No. 16/920,458, filed Jul. 3, 2020 and entitled "Electronic Device", now U.S. Pat. No. 11,424,552, which claims priority of Chinese Patent Application No. 201910603673.9, filed on Jul. 5, 2019, the entirety of which are incorporated by reference herein.

BACKGROUND

Technical Field

The present disclosure relates to an electronic device, and in particular it relates to an electronic device having a phase shifter electrode controlled by an active driving element.

Description of the Related Art

Recently, some of the electronic products can be used as electronic modulation devices, for example, as antenna devices that can modulate electromagnetic waves. However, the current antenna devices have not been satisfactory in all respects. For example, in antenna arrays where the phase shifter electrodes are controlled by passive driving elements, there may be problems of circuits coupling or short circuits.

Therefore, the development of an antenna device that can effectively maintain the stability or the operation reliability for modulating electromagnetic wave is still one of the goals that the industry is currently aiming at.

SUMMARY

In accordance with some embodiments of the present disclosure, a phase-array antenna is provided. The phase-array antenna includes a plurality of antenna units arranged in an array. One of the plurality antenna units includes a substrate, a feeding line, a conductor and an active element. The feeding line is disposed on the substrate and has a signal transmitting end. The conductor is disposed on the substrate and has a signal receiving end. The active element is disposed on the substrate and includes an active layer. The signal transmitting end of the feeding line is apart from the signal receiving end of the conductor by 0.05 mm to 5 mm, and the active layer is apart from the feeding line by 1 mm to 200 mm.

In accordance with some embodiments of the present disclosure, a phase-array antenna is provided. The phase-array antenna includes a plurality of antenna units arranged in an array. The phase-array antenna includes a substrate, a plurality of conductors and a plurality of patch elements. The plurality of conductors are disposed on the substrate. The plurality of patch elements are disposed on the plurality of conductors respectively. Moreover, a distance between adjacent two of the plurality of patch elements is in a range from 0.1 mm to 300 mm.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION

Figure 1A:
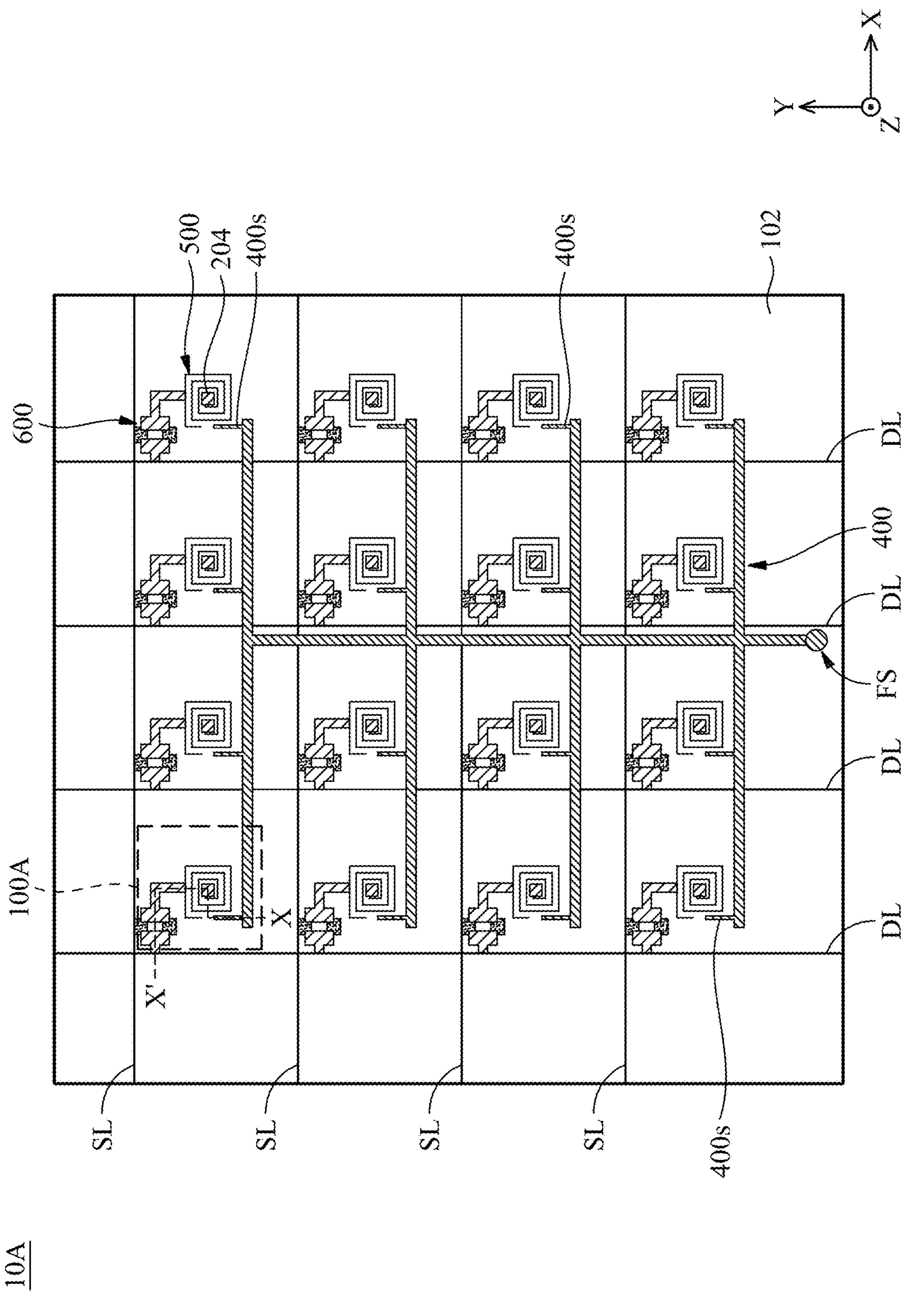
FIG. 1A is a top-view diagram of an electronic device in accordance with some embodiments of the present disclosure.

The electronic device of the present disclosure is described in detail in the following description. It should be understood that in the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent that the exemplary embodiments set forth herein are used merely for the purpose of illustration. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments.

It should be understood that the elements or devices in the drawings of the present disclosure may be present in any form or configuration known to those with ordinary skill in the art. In addition, in the embodiments, relative expressions are used. For example, "lower", "bottom", "higher" or "top" are used to describe the position of one element relative to another. It should be appreciated that if a device is flipped upside down, an element that is "lower" will become an element that is "higher". It should be understood that the descriptions of the exemplary embodiments are intended to be read in connection with the accompanying drawings, which are to be considered part of the entire written description. The drawings are not drawn to scale. In fact, the size of the element may be arbitrarily enlarged or reduced in order to clearly express the features of the present disclosure.

In addition, it should be understood that, although the terms first, second, third etc. may be used herein to describe various elements, components, or portions, these elements, components, or portions should not be limited by these terms. These terms are only used to distinguish one element, component, area, layer, or portion from another element, component, area, layer, or portion. Thus, a first element, component, area, layer, or portion discussed below could be termed a second element, component, area, layer, or portion without departing from the teachings of the present disclosure.

The terms "about", "approximately", "substantially", "generally" typically mean +/−10% of the stated value, or +/−10% of the stated value, or +/−5% of the stated value, or +/−3% of the stated value, or +/−2% of the stated value, or +/−1% of the stated value, or +/−0.5% of the stated value. The stated value of the present disclosure is an approximate value. When there is no specific description, the stated value includes the meaning of "about", "approximately", "substantially", "generally". In addition, the terms "the range is from the first value to the second value" and "the range is between the first value and the second value" means that the range includes the first value, the second value, and other values between them.

In some embodiments of the present disclosure, terms concerning attachments, approximately coupling and the like, such as "connected" and "interconnected", refer to a relationship wherein structures are secured or attached to one another either directly or indirectly through intervening structures, as well as both movable or rigid attachments or relationships, unless expressly described otherwise. In addition, the term "coupled" includes any direct and indirect electrical connection means.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

In accordance with some embodiments of the present disclosure, an electronic device that is provided includes a phase shifter electrode that is electrically connected to an active driving element (for example, a thin film transistor). Compared with the phase shifter electrode array that is controlled by using a passive driving element (for example, integrated circuits and digital analog converters), the electronic device provided in the present disclosure can improve the problem of circuits coupling or short circuits that may be caused by insufficient wiring space, or reduce the complexity of the circuit or the power consumption of the electronic device. In accordance with some embodiments, the problem of receiving inconsistent feeding voltages among different phase shifter electrodes can be improved by using phase shifter electrodes that are each electrically connected to the active driving element.

In accordance with some embodiments of the present disclosure, the provided electronic device may include an antenna device, a liquid crystal display device, a sensing device or a tiled device, but it is not limited thereto. The electronic device may be a bendable or flexible electronic device. The antenna device may be, for example, a liquid crystal antenna, but it is not limited thereto. The tiled device may be, for example, an antenna tiled device, but it is not limited thereto. It should be noted that the electronic device may be any arrangement and combination of the aforementioned devices, and the present disclosure is not limited thereto.

Refer to FIG. 1A, which is a top-view diagram of an electronic device 10A in accordance with some embodiments of the present disclosure. It should be understood that, for clarity, some elements (e.g., the second substrate 202, the fourth insulating layer 206, the first conductive layer 208, etc.) are omitted in the figure, and only a portion of the modulation units 100A of the electronic device 10A is schematically illustrated. In different embodiments, the number of the modulation units 100A of the electronic device 10A can be adjusted according to needs. In addition, it should be understood that in accordance with some embodiments, additional features may be added to the electronic device 10A described below. In some other embodiments, some features of the electronic device 10A described below may be replaced or omitted.

As shown in FIG. 1A, the electronic device 10A may include a first substrate 102 and a plurality of modulation units 100A disposed on the first substrate 102. In accordance with some embodiments, the electronic device 10A may include an antenna device, a display device (for example, a liquid crystal display (LCD)), a light-emitting device, a detection device, a tiled device, or other devices for modulating electromagnetic waves, but the present disclosure is not limited thereto. In some embodiments, the electronic device 10A may be an antenna device, and the modulation unit 100A may be an antenna unit for modulating electromagnetic waves (for example, radio frequency or microwave).

In some embodiments, the material of the first substrate 102 may include glass, quartz, sapphire, ceramic, polyimide (PI), liquid crystal polymer (LCP) material, polycarbonate (PC), photo sensitive polyimide (PSPI), polyethylene terephthalate (PET), other suitable substrate materials, or a combination thereof, but it is not limited thereto. In some embodiments, the first substrate 102 may be a flexible substrate, a rigid substrate, or a combination thereof.

Furthermore, as shown in FIG. 1A, the electronic device 10A may include a feeding structure 400. The feeding structure 400 may be disposed on the first substrate 102 for transmitting radio frequency signals, and the feeding structure 400 may include a plurality of feeding lines 400*s*. In some embodiments, one feeding line 400*s* may correspond to one modulation unit 100A, but it is not limited thereto. In some embodiments, the feeding structure 400 may be coupled to at least one feeding source FS, and the feeding source FS may provide an initial feeding wave. In some embodiments, the initial feed wave may be a high-frequency electromagnetic wave. In addition, in some embodiments, the feeding structure 400 may be further coupled to a signal processor, a signal modulator, or a combination thereof (not illustrated).

In some embodiments, the feeding structure 400 may include a wire material, such as a conductive material. In some embodiments, the conductive material may include copper (Cu), silver (Ag), tin (Sn), aluminum (Al), molybdenum (Mo), tungsten (W), gold (Au), chromium (Cr), nickel (Ni), platinum (Pt), titanium (Ti), copper alloy, silver alloy, tin alloy, aluminum alloy, molybdenum alloy, tungsten alloy, gold alloy, chromium alloy, nickel alloy, platinum alloy, titanium alloy, other suitable conductive materials, or a combination thereof, but it is not limited thereto.

In addition, the electronic device 10A may include a plurality of phase shifter electrodes 500 (also referred to as microstrips). The phase shifter electrodes 500 may be disposed on the first substrate 102, and at least one of the phase shifter electrodes 500 may be used to receive signals the radio frequency signal from the feeding structure 400. Specifically, the feeding structure 400 may transmit the radio frequency signal to the phase shifter electrode 500 through the feeding line 400*s* in a manner of inducing current, inducing electric field or inducing magnetic field.

In some embodiments, the material of the phase shifter electrode 500 may include a metal conductive material, a transparent conductive material, or a combination thereof. The metal conductive material may include copper (Cu), silver (Ag), tin (Sn), aluminum (Al), molybdenum (Mo), tungsten (W), gold (Au), chromium (Cr), nickel (Ni), platinum (Pt), titanium (Ti), copper alloy, silver alloy, tin alloy, aluminum alloy, molybdenum alloy, tungsten alloy, gold alloy, chromium alloy, nickel alloy, platinum alloy, titanium alloy, other suitable conductive materials or a combination thereof, but it is not limited thereto. The transparent conductive material may include a transparent conductive oxide (TCO). For example, the transparent conductive oxide may include indium tin oxide (ITO), tin oxide (SnO), zinc oxide (ZnO), indium zinc oxide (IZO), indium gallium zinc oxide (IGZO), indium tin zinc oxide (ITZO), antimony tin oxide (ATO), antimony zinc oxide (AZO), or a combination thereof, but it is not limited thereto.

In addition, at least one of the phase shifter electrodes 500 may be electrically connected to a thin film transistor (TFT) 600. As shown in FIG. 1A, in some embodiments, the phase shifter electrodes 500 may be electrically connected to the thin film transistors 600 respectively, and the thin film transistors 600 may be further electrically connected to the data line DL and the scan line (gate line) SL. In addition, in some embodiments, the phase shifter electrodes 500 may be electrically connected to the thin film transistor 600, the integrated circuit (IC) and/or the digital analog converter. In other words, in some embodiments, the phase shifter electrodes 500 may be controlled by the active driving element, and may also be controlled by the passive driving element.

In addition, in some embodiments, the phase shifter electrode 500 may be coupled to a low-frequency voltage. In accordance with some embodiments, the low-frequency voltage may be in a range from ±0.1 volts (V) to ±100V, from ±0.5V to ±50V, or from ±1V to ±15V, but the present disclosure is not limited thereto.

Generally, in an array controlled by the passive driving element (e.g., the integrated circuit and the digital analog converter), at least two of the lengths of the wires connecting the integrated circuit (or digital analog converter) and the phase shifter electrode are different, so that the feeding voltages received by at least two phase shifter electrodes are different. Compared with the array controlled by the passive driving element, in the array controlled by the phase shifter electrodes 500 electrically connected to the thin film transistors 600, the phase shifter electrodes 500 may have a uniform feeding voltage or may reduce the risk of signal distortion.

Furthermore, the electronic device 10A may include a patch element 204, and the patch element 204 may be disposed on at least one of the plurality of phase shifter electrodes 500. As shown in FIG. 1A, in some embodiments, the patch element 204 may be disposed on the phase shifter electrode 500. In other words, in some embodiments, at least a portion of the patch element 204 may overlap with the phase shifter electrode 500 in a normal direction of the first substrate 102 (for example, the Z direction shown in the figure). In some embodiments, the patch element 204 may be electrically floated, coupled to a fixed electric potential (e.g., ground), or coupled to other functional circuits, but it is not limited thereto.

In some embodiments, the material of the patch element 204 may include a metal conductive material, a transparent conductive material, or a combination thereof. The metal conductive material may include copper (Cu), silver (Ag), tin (Sn), aluminum (Al), molybdenum (Mo), tungsten (W), gold (Au), chromium (Cr), nickel (Ni), platinum (Pt), titanium (Ti), copper alloy, silver alloy, tin alloy, aluminum alloy, molybdenum alloy, tungsten alloy, gold alloy, chromium alloy, nickel alloy, platinum alloy, titanium alloy, other suitable conductive materials, or a combination thereof, but it is not limited thereto. The transparent conductive material may include a transparent conductive oxide (TCO). The transparent conductive oxide may include indium tin oxide (ITO), tin oxide (SnO), zinc oxide (ZnO), indium zinc oxide (IZO), indium gallium zinc oxide (IGZO), indium tin zinc oxide (ITZO), antimony tin oxide (ATO), antimony zinc oxide (AZO), or a combination thereof, but it is not limited thereto.

Figure 1B:
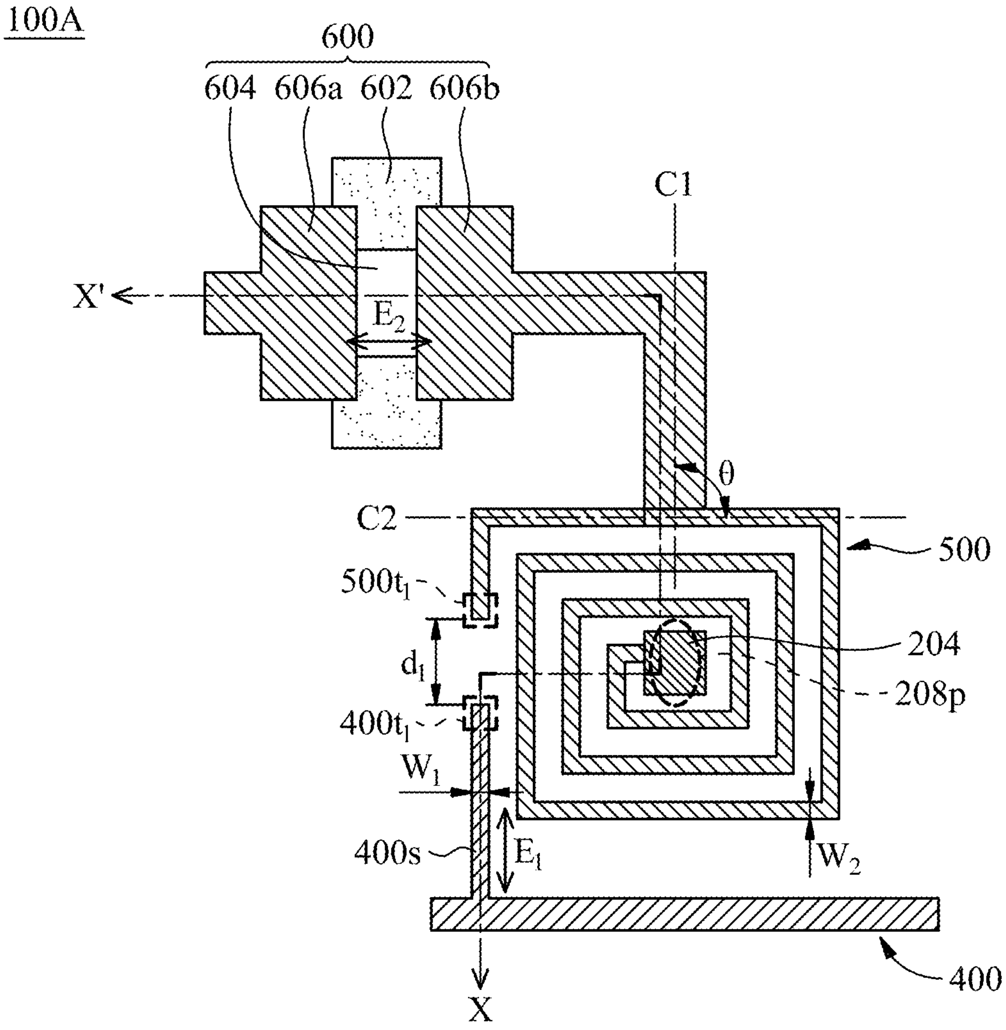
FIG. 1B is an enlarged diagram of a portion of an electronic device in accordance with some embodiments of the present disclosure.

Next, refer to FIG. 1B, which is an enlarged diagram of a portion of the electronic device 10A in accordance with some embodiments of the present disclosure. Specifically, FIG. 1B illustrates the enlarged diagram of the modulation unit 100A in the block of FIG. 1A. As shown in FIG. 1B, the thin film transistor 600 may include a gate electrode 602, an active layer 604, a drain electrode 606*a*, and a source electrode 606*b*. In some embodiments, the gate electrode 602 may be electrically connected to a scan line SL, the drain electrode 606*a* may be electrically connected to a data line DL, and the source electrode 606*b* may be electrically connected to the phase shifter electrode 500.

In some embodiments, in the top-view direction of the electronic device 10A (for example, the X-Y plane in the normal direction of the first substrate 102 (i.e. in the Z direction in FIG. 1A)), the position where the thin film transistor 600 intersects with the phase shifter electrode 500 (that is, the intersection between the source electrode 606*b* and the phase shifter electrode 500) has an included angle a. In some embodiments, the included angle θ may be in a range from 30 degrees to 150 degrees (i.e. 30 degrees≤the included angle θ≤150 degrees), from 45 degrees to 135 degrees, or from 60 degrees to 120 degrees, for example, 80 degrees, 85 degrees, 90 degrees, or 95 degrees. In accordance with some embodiments, the included angle θ may refer to an included angle formed between a center line C1 of the source electrode 606*b* and a center line C2 of the phase shifter electrode 500 at the intersection position of the source electrode 606*b* and the phase shifter electrode 500.

Furthermore, the phase shifter electrode 500 is adjacent to the feeding structure 400, and the phase shifter electrode 500 may have a spiral shape or a loop shape, but it is not limited thereto. The aspects of the shape of the phase shifter electrode 500 will be further described below. As shown in FIG. 1B, the end of the feeding line 400*s* of the feeding structure 400 may have an end portion 400*$t_1$*, the end of the phase shifter electrode 500 may have an end portion 500*$t_1$*, and the end portion 400*$t_1$* may be adjacent to the end portion 500*$t_1$*.

In some embodiments, the end portion 400*$t_1$* of the feeding line 400*s* of the feeding structure 400 may be disposed opposite the end portion 500*$t_1$* of the phase shifter electrode 500. Furthermore, in some embodiments, the extending direction of the end portion 400*$t_1$* and the extending direction of the end portion 500*$t_1$* may be parallel to each other. Specifically, the end portion 400*$t_1$* of the feeding line 400*s* and the end portion 500*$t_1$* of the phase shifter electrode 500 may be separated by a first distance $d_1$. In some embodiments, the first distance $d_1$ may be in a range from 0.05 millimeters (mm) to 5 millimeters (i.e. 0.05 mm≤the first distance $d_1$≤5 mm), from 0.5 mm to 4.5 mm, or from 1 mm to 3 mm, for example, 1.5 mm, 2 mm, or 2.5 mm. In addition, it should be understood that in accordance with some embodiments of the present disclosure, as shown in FIG. 1B, the first distance $d_1$ may refer to the minimum distance along the extending direction (for example, a first longitudinal direction $E_1$) of the feeding line 400*s*.

It should be noted that if the first distance $d_1$ is too small (e.g., less than 0.05 mm), the feeding structure 400 and the phase shifter electrode 500 may contact each other due to process tolerances and cause short circuits. On the other hand, if the first distance $d_1$ is too large (e.g., greater than 5 mm), the feeding structure 400 may be difficult to generate a coupling effect because it is too far away from the phase shifter electrode 500, and the RF signal may not be effectively fed to the phase shifter electrode 500.

Moreover, the feeding line 400*s* of the feeding structure 400 may have a first width $W_1$. In some embodiments, the first width $W_1$ may be in a range from 10 μm to 500 μm (i.e. 10 μm≤the first width $W_1$≤500 μm), from 50 μm to 450 μm, from 100 μm to 400 μm, or from 150 μm to 350 μm, for example, 200 μm, 250 μm, or 300 μm.

On the other hand, the phase shifter electrode 500 may have a second width $W_2$. In some embodiments, the second width $W_2$ may be in a range from 5 μm to 500 μm (i.e. 5 μm≤the second width $W_2$≤500 μm), from 10 μm to 400 μm, from 50 μm to 350 μm, or from 100 μm to 300 μm, for example, 150 μm, 200 μm, or 250 μm.

In some embodiments, the first width $W_1$ of the feeding line 400*s* may be greater than or equal to the second width $W_2$ of the phase shifter electrode 500. In addition, it should be understood that in accordance with some embodiments of the present disclosure, the first width $W_1$ of the feeding line 400*s* may refer to the maximum width of any cross section that is perpendicular to the extending direction (for example, the first longitudinal direction $E_1$) of the feeding line 400*s*. Similarly, in accordance with some embodiments of the present disclosure, the second width $W_2$ of the phase shifter electrode 500 may refer to the maximum width of any cross section that is perpendicular to the extending direction (not illustrated) of the phase shifter electrode 500.

As described above, the patch element 204 may be disposed on the phase shifter electrode 500 and overlap with the phase shifter electrode 500. Specifically, as shown in FIG. 1B, in some embodiments, in a normal direction of the first substrate 102, the patch element 204 may overlap with the other end portion 500*$t_2$* of the phase shifter electrode 500 (e.g., refer to FIGS. 5A-5D). In addition, in some embodiments, in a normal direction of the first substrate 102, the patch element 204 also may overlap with an opening 208*p* of a first conductive layer 208. In other words, in some embodiments, the patch element 204 may overlap with the end portion 500*$t_2$* and the opening 208*p* of the phase shifter electrode 500 at the same time (e.g., refer to FIG. 1C). In some embodiments, the patch element 204 may overlap with an opening 208*p* of the first conductive layer 208 and may not overlap with the end portion 500*$t_2$*.

Furthermore, the feeding line 400*s* may extend along the first longitudinal direction $E_1$, and the active layer 604 of the thin film transistor 600 may extend along the second longitudinal direction $E_2$. In some embodiments, the included angle (not illustrated) between the first longitudinal direction $E_1$ and the second longitudinal direction $E_2$ may be in a range from 30 degrees to 150 degrees (i.e. 30 degrees≤the included angle between the first longitudinal direction $E_1$ and the second longitudinal direction $E_2$≤150 degrees), from 45 degrees to 135 degrees, or from 60 degrees to 120 degrees, for example, 80 degrees, 85 degrees, 90 degrees, or 95 degrees.

In accordance with some embodiments of the present disclosure, the term "longitudinal direction" may refer to a direction that is along or substantially parallel to the long axis of an object. The long axis is defined as a straight line extending lengthwise through the center of the object. For an elongated or oval object, the long axis is closest to its maximum longitudinal dimension. For objects that do not have a clear long axis, the long axis may represent the long side of the smallest rectangle that can surround the object.

In addition, as shown in FIG. 1B, in the top-view direction of the electronic device 10A or the modulation unit 100A (for example, the X-Y plane in the normal direction of the first substrate 102 (i.e. in the Z direction in FIG. 1B)), the active layer 604 of the thin film transistor 600 do not overlap with the phase shifter electrode 500. In some embodiments, the active layer 604 of the thin film transistor 600 do not overlap with the feeding structure 400 (including the feeding line 400*s*) in the top-view direction of the electronic device 10A or the modulation unit 100A. In some embodiments, in the top-view direction of the electronic device 10A or the modulation unit 100A, the active layer 604 of the thin film transistor 600 and the patch element 204 do not overlap. In other words, in accordance with some embodiments, a distance is maintained between the active layer 604 and the phase shifter electrode 500, the feeding structure 400, and the patch element 204, that is, they do not overlap each other.

Specifically, when the switch of the thin film transistor 600 is turned on, charges will accumulate in the active layer 604, and then the voltage signal will be written from the data line DL, and a high frequency radio frequency signal will generate induced current at the phase shifter electrode 500. The current easily interferes with the free charges of the active layer 604, which causes the problem of communication crosstalk. In accordance with some embodiments, with the aforementioned configuration (the active layer 604 of the thin film transistor 600 does not overlap with the phase shifter electrode 500, the feeding structure 400, and the patch element 204), the problem of communication crosstalk can be reduced, or the impact on antenna performance can be reduced.

Figure 1C:
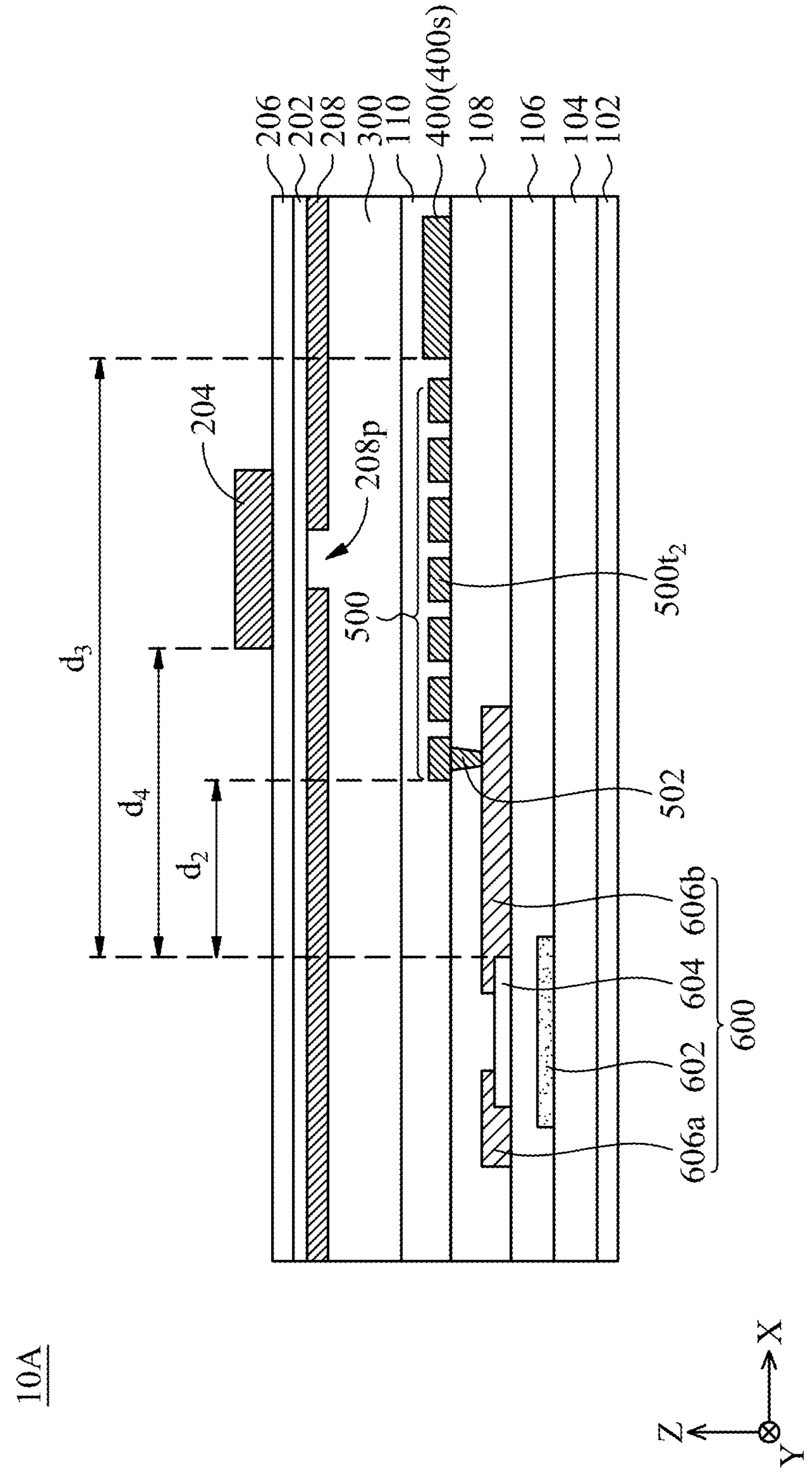
FIG. 1C is a cross-sectional diagram of an electronic device in accordance with some embodiments of the present disclosure.

Next, refer to FIG. 1C, which is a cross-sectional diagram of the electronic device 10A in accordance with some embodiments of the present disclosure. Specifically, FIG. 1C shows a cross-sectional structure of the modulation unit 100A along a section line X-X' in FIG. 1B. As described above, the electronic device 10A may include the first substrate 102 and the second substrate 202. In addition, as shown in FIG. 1C, the electronic device 10A may include a liquid crystal layer 300. The liquid crystal layer 300 may be disposed between the first substrate 102 and the second substrate 202.

In some embodiments, the material of the liquid crystal layer 300 may include nematic liquid crystal, smectic liquid crystal, cholesteric liquid crystal, blue-phase liquid crystal, other suitable liquid crystal materials or a combination thereof, but it is not limited thereto. In accordance with some embodiments, the capacitance may be adjusted by applying different electric fields to the liquid crystal layer 300 to control the transmission direction of the electromagnetic signals passing through the opening 208*p* and the patch element 204.

It should be noted that, in general patch antenna devices, the thin film transistor and the patch element are disposed on the same side (e.g., relative to the liquid crystal layer 300). However, in accordance with some embodiments of the present disclosure, the thin film transistor 600 and the phase shifter electrode 500 are disposed on the same side (e.g., relative to the liquid crystal layer 300). In other words, in some embodiments, the thin film transistor 600 may be disposed between the liquid crystal layer 300 and the first substrate 102.

As described above, in accordance with some embodiments, the electronic device 10A includes the first conductive layer 208. As shown in FIG. 1C, the first conductive layer 208 may be disposed on the second substrate 202, and may be between the liquid crystal layer 300 and the second substrates 202. Specifically, in some embodiments, the first conductive layer 208 may be patterned to have the opening 208*p*. In some embodiments, the first conductive layer 208 may be grounded.

In some embodiments, the material of the first conductive layer 208 may include a metal conductive material, a transparent conductive material, or a combination thereof. The metal conductive material may include copper (Cu), silver (Ag), tin (Sn), aluminum (Al), molybdenum (Mo), tungsten (W), gold (Au), chromium (Cr), nickel (Ni), platinum (Pt), titanium (Ti), copper alloy, silver alloy, tin alloy, aluminum alloy, molybdenum alloy, tungsten alloy, gold alloy, chromium alloy, nickel alloy, platinum alloy, titanium alloy, other suitable conductive materials or a combination thereof, but it is not limited thereto. The transparent conductive material may include a transparent conductive oxide (TCO). For example, the transparent conductive oxide may include indium tin oxide (ITO), tin oxide (SnO), zinc oxide (ZnO), indium zinc oxide (IZO), indium gallium zinc oxide (IGZO), indium tin zinc oxide (ITZO), antimony tin oxide (ATO), antimony zinc oxide (AZO) or the a combination thereof, but it is not limited thereto.

Specifically, in some embodiments, a physical vapor deposition (PVD) process, a chemical vapor deposition (CVD) process, a coating process, an electroplating process, an electroless plating process, other suitable processes, or a combination thereof may be used to form the first conductive layer 208. For example, the physical vapor deposition process may include a sputtering process, an evaporation process, or a pulsed laser deposition process, but it is not limited thereto. For example, the chemical vapor deposition process may include a low pressure chemical vapor deposition (LPCVD) process, a low temperature chemical vapor deposition (LTCVD) process, a rapid thermal chemical vapor deposition (RTCVD) process, a plasma enhanced chemical vapor deposition (PECVD) process, or an atomic layer deposition (ALD) process, but it is not limited thereto.

In some embodiments, the patterning process may include a photolithography process and an etching process. The photolithography process may include, but is not limited to, photoresist coating (e.g., spin coating), soft baking, hard baking, mask alignment, exposure, post-exposure baking, photoresist development, cleaning, and drying. The etching process may include, but is not limited to, a dry etching process or a wet etching process.

As described above, in some embodiments, the thin film transistor 600 may be disposed between the liquid crystal layer 300 and the first substrate 102. More specifically, in some embodiments, the electronic device 10A may further include a buffer layer 104, a first insulating layer 106, a second insulating layer 108, and a third insulating layer 110 that are sequentially disposed on the first substrate 102. In some embodiments, the buffer layer 104 may be disposed on the first substrate 102 and located between the thin film transistor 600 and the first substrate 102. In some embodiments, the gate electrode 602 of the thin film transistor 600 may be disposed on the buffer layer 104.

In some embodiments, the buffer layer 104 may be formed of an insulating material. In some embodiments, the material of the buffer layer 104 may include an organic material, an inorganic material, or a combination thereof, but it is not limited thereto. The organic material may include polyethylene terephthalate (PET), polyethylene (PE), polyethersulfone (PES), polycarbonate (PC), polymethylmethacrylate (PMMA), isoprene, phenol-formaldehyde resin, benzocyclobutene (BCB), perfluorocyclobutane (PECB), or a combination thereof, but it is not limited thereto. The inorganic material may include silicon nitride, silicon oxide, silicon oxynitride, or a combination thereof, but it is not limited thereto.

In some embodiments, the buffer layer 104 may be a single layer structure. In some other embodiments, the buffer layer 104 may include a plurality of sublayers. In the embodiments where the buffer layer 104 includes a plurality of sub-layers, the material of each sub-layer may be the same or different.

In addition, in some embodiments, the material of the gate electrode 602 may include copper (Cu), aluminum (Al), molybdenum (Mo), tungsten (W), gold (Au), chromium (Cr), nickel (Ni), platinum (Pt), titanium (Ti), copper alloy, aluminum alloy, molybdenum alloy, tungsten alloy, gold alloy, chromium alloy, nickel alloy, platinum alloy, titanium alloy, other suitable metal materials or a combination thereof, but it is not limited thereto.

As shown in FIG. 1C, in some embodiments, the first insulating layer 106 may be disposed between the gate electrode 602 and the active layer 604. In some embodiments, the first insulating layer 106 may serve as a gate dielectric layer. In some embodiments, the drain electrode 606*a* and the source electrode 606*b* may be disposed on the first insulating layer 106, and the drain electrode 606*a* and the source electrode 606*b* may partially overlap with the active layer 604.

In some embodiments, the material of the first insulating layer 106 may include silicon oxide, silicon nitride, silicon oxynitride, high-k dielectric material, other suitable dielectric materials, or a combination thereof, but it is not limited thereto. For example, the high-k dielectric material may include, but is not limited to, metal oxide, metal nitride, metal silicide, metal aluminate, zirconium silicate, zirconium aluminate, or a combination thereof. The inorganic material may include, but is not limited to, silicon nitride, silicon dioxide, silicon oxynitride, or a combination thereof. The organic material may include, but is not limited to, perfluoroalkoxy alkane (PFA), polytetrafluoroethylene (PTFE), fluorinated ethylene propylene (FEP), polyethylene, or a combination thereof.

In some embodiments, the material of the active layer 604 may include amorphous silicon, polycrystalline silicon, metal nitride, metal oxide, other suitable materials, or a combination thereof, but it is not limited thereto.

In some embodiments, the material of the drain electrode 606*a* and the source electrode 606*b* may include copper (Cu), aluminum (Al), molybdenum (Mo), tungsten (W), gold (Au), chromium (Cr), nickel (Ni), platinum (Pt), titanium (Ti), copper alloy, aluminum alloy, molybdenum alloy, tungsten alloy, gold alloy, chromium alloy, nickel alloy, platinum alloy, titanium alloy, other suitable metal materials or a combination thereof, but it is not limited thereto.

In addition, in some embodiments, the second insulating layer 108 may be disposed on the first insulating layer 106 and cover the active layer 604, the drain electrode 606*a*, and the source electrode 606*b*. In some embodiments, the phase shifter electrode 500 and the feeding structure 400 may be disposed on the second insulating layer 108. Furthermore, in some embodiments, the third insulating layer 110 may be disposed on the second insulating layer 108 and cover the phase shifter electrode 500 and the feeding structure 400. Moreover, the materials of the second insulating layer 108 and the third insulating layer 110 may be the same as or similar to that of the first insulating layer 106, and thus will not be repeated herein.

As described above, in some embodiments, the phase shifter electrode 500 may be electrically connected to the thin film transistor 600. Specifically, the phase shifter electrode 500 may be electrically connected to the source electrode 606*b* of the thin film transistor 600 through a via 502. In addition, the material of the via 502 may be the same as or different from that of the phase shifter electrode 500.

Furthermore, as shown in FIG. 1C, in some embodiments, the electronic device 10A may further include a fourth insulating layer 206 disposed between the second substrate 202 and the patch element 204. The material of the fourth insulating layer 206 may be the same as or similar to that of the first insulating layer 106, and thus will not be repeated herein.

In some embodiments, the active layer 604 and the phase shifter electrode 500 may be separated by a second distance $d_2$. In some embodiments, the second distance $d_2$ may be in a range from 0.1 mm to 100 mm (i.e. 0.1 mm≤the second distance $d_2$≤100 mm), from 1 mm to 90 mm, or from 10 mm to 80 mm, for example, 20 mm, 30 mm, 40 mm, 50 mm, 60 mm, or 70 mm.

In accordance with the embodiments of the present disclosure, the second distance $d_2$ may refer to the minimum distance between the active layer 604 and the phase electrodes 500 in a direction that is perpendicular to the normal direction of the first substrate 102 (for example, the X direction shown in the figure). Alternatively, in accordance with the embodiments of the present disclosure, the second distance $d_2$ may also refer to the minimum distance between the projections of the active layer 604 and the phase shifter electrode 500 on the first substrate 102.

Furthermore, in some embodiments, the active layer 604 and the feeding structure 400 may be separated by a third distance $d_3$. In some embodiments, the third distance $d_3$ may be in a range from 1 mm to 200 mm (i.e. 1 mm≤the third distance $d_3$≤200 mm), from 20 mm to 180 mm, or from 50 mm to 150 mm, for example, 70 mm, 80 mm, 90 mm, 100 mm, 110 mm, 120 mm, or 130 mm.

In accordance with the embodiments of the present disclosure, the third distance $d_3$ may refer to the minimum distance between the active layer 604 and the feeding structure 400 in a direction that is perpendicular to the normal direction of the first substrate 102 (for example, the X direction shown in the figure). Alternatively, in accordance with the embodiments of the present disclosure, the third distance $d_3$ may also refer to the minimum distance between the projections of the active layer 604 and the feeding structure 400 on the first substrate 102.

Furthermore, in some embodiments, the active layer 604 and the patch element 204 may be separated by a fourth distance $d_4$. In some embodiments, the fourth distance $d_4$ may be in a range from 0.1 mm to 150 mm (i.e. 0.1 mm≤the fourth distance $d_4$≤150 mm), from 10 mm to 130 mm, or from 30 mm to 110 mm, for example, 50 mm, 60 mm, 70 mm, 80 mm, 90 mm, or 100 mm.

In accordance with the embodiments of the present disclosure, the fourth distance $d_4$ may refer to the minimum distance between the active layer 604 and the patch element 204 in the direction that is perpendicular to the normal direction of the first substrate 102 (for example, the X direction shown in the figure). Alternatively, in accordance with the embodiments of the present disclosure, the fourth distance $d_4$ may also refer to the minimum distance between the projections of the active layer 604 and the patch element 204 on the first substrate 102.

As mentioned above, in accordance with some embodiments, a distance is maintained between the active layer 604 of the thin film transistor 600 and the phase shifter electrode 500, the feeding structure 400, and the patch element 204, thereby reducing the effect of communication crosstalk, or reduce the impact on antenna performance.

In addition, in accordance with some embodiments, the electronic device 10A may further include spacer elements (not illustrated) disposed between the first substrate 102 and the second substrate 202 to enhance the structural strength of the electronic device 10A. In some embodiments, the spacer elements may have a ring structure. In some embodiments, the spacer elements may have a columnar structure and be arranged in parallel, but it is not limited thereto.

Furthermore, the material of the spacer element may include an insulating material, a conductive material, or a combination thereof. The conductive material may include copper, silver, gold, copper alloy, silver alloy, gold alloy, or a combination thereof, but it is not limited thereto. The insulating material may include polyethylene terephthalate (PET), polyethylene (PE), polyethersulfone (PES), polycarbonate (PC), polymethylmethacrylate (PMMA), glass, or a combination thereof, but it is not limited thereto.

Next, refer to FIGS. 2A-2D, which are cross-sectional diagrams of the electronic device 10A during the manufacturing process in accordance with some embodiments of the present disclosure. Specifically, FIGS. 2A-2D illustrate the steps of forming a portion of the elements (elements that are formed on the first substrate 102) of the electronic device 10A. It should be understood that in accordance with some embodiments, additional operation steps may be provided before, during and/or after the manufacturing process of the electronic device 10A is performed. In accordance with some embodiments, some of the operation steps may be replaced or omitted. In accordance with some embodiments, the order of the operation steps may be interchangeable.

Figure 2A:
FIGS. 2A-2D are cross-sectional diagrams of an electronic device during the manufacturing process in accordance with some embodiments of the present disclosure.

Referring to FIG. 2A, in some embodiments, the first substrate 102 may be provided, and then the buffer layer 104 may be formed on the first substrate 102. In some embodiments, the buffer layer 104 may be formed by a physical vapor deposition process, a chemical vapor deposition process, a coating process, other suitable processes, or a combination thereof. The physical vapor deposition process may include, for example, a sputtering process, an evaporation process, or a pulsed laser deposition process, but it is not limited thereto. The chemical vapor deposition process may include, for example, a low pressure chemical vapor deposition (LPCVD) process, a low temperature chemical vapor deposition (LTCVD) process, a rapid thermal chemical vapor deposition process (RTCVD) process, a plasma enhanced chemical vapor deposition (PECVD) process, an atomic layer deposition (ALD) process, etc., but it is not limited thereto.

Next, in accordance with some embodiments, the gate electrode 602 may be formed on the buffer layer 104. In some embodiments, the scan line SL (not illustrated) may be formed simultaneously in the step of forming the gate electrode 602.

In some embodiments, the gate electrode 602 and/or the scan line SL may be formed by the physical vapor deposition process, the chemical vapor deposition process, the electroplating process, the electroless plating process, other suitable processes, or a combination thereof. In addition, in some embodiments, the gate electrode 602 and/or the scan line SL may be patterned by a patterning process. In some embodiments, the patterning process may include a photolithography process and an etching process. The photolithography process may include, but is not limited to, photoresist coating (e.g., spin coating), soft baking, hard baking, mask alignment, exposure, post-exposure baking, photoresist development, cleaning, and drying. The etching process may include, but is not limited to, a dry etching process or a wet etching process.

Next, in accordance with some embodiments, the first insulating layer 106 may be formed on the gate electrode 602 to cover the gate electrode 602. In some embodiments, the first insulating layer 106 may be formed by the physical vapor deposition process, the chemical vapor deposition process, the coating process, other suitable processes, or a combination thereof.

Thereafter, in accordance with some embodiments, the active layer 604 may be formed on the first insulating layer 106. In some embodiments, the active layer 604 may overlap with the gate electrode 602 in a normal direction of the first substrate 102 (for example, the Z direction shown in the figure).

In some embodiments, the active layer 604 may be formed by the physical vapor deposition process, the chemical vapor deposition process, other suitable processes, or a combination thereof. Moreover, in some embodiments, the active layer 604 may be patterned by a patterning process.

Figure 2B:
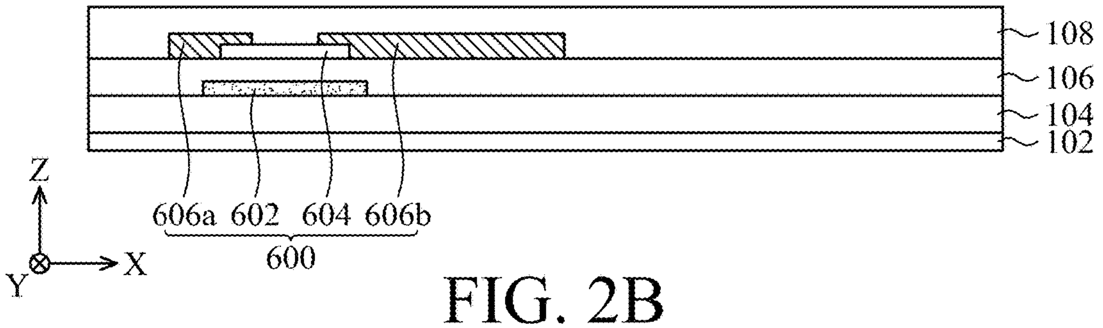

As shown in FIG. 2B, in accordance with some embodiments, after the active layer 604 is formed on the first insulating layer 106, the drain electrode 606*a* and the source electrode 606*b* may be further formed on the first insulating layer 106. The drain electrode 606*a* and the source electrode 606*b* may be disposed on both sides of the active layer 604, and the drain electrode 606*a* and the source electrode 606*b* may partially cover the active layer 604. Here, the steps of forming the thin film transistor 600 are substantially completed.

In some embodiments, the drain electrode 606*a* and the source electrode 606*b* may be formed by the physical vapor deposition process, the chemical vapor deposition process, the electroplating process, the electroless plating process, other suitable processes, or a combination thereof. In addition, in some embodiments, the drain electrode 606*a* and the source electrode 606*b* may be patterned by a patterning process.

In accordance with some embodiments, the second insulating layer 108 may then be formed on the first insulating layer 106 to cover the active layer 604, the drain electrode 606*a*, and the source electrode 606*b*. In some embodiments, the second insulating layer 108 may be formed by the physical vapor deposition process, the chemical vapor deposition process, the coating process, other suitable processes, or a combination thereof.

Figure 2C:
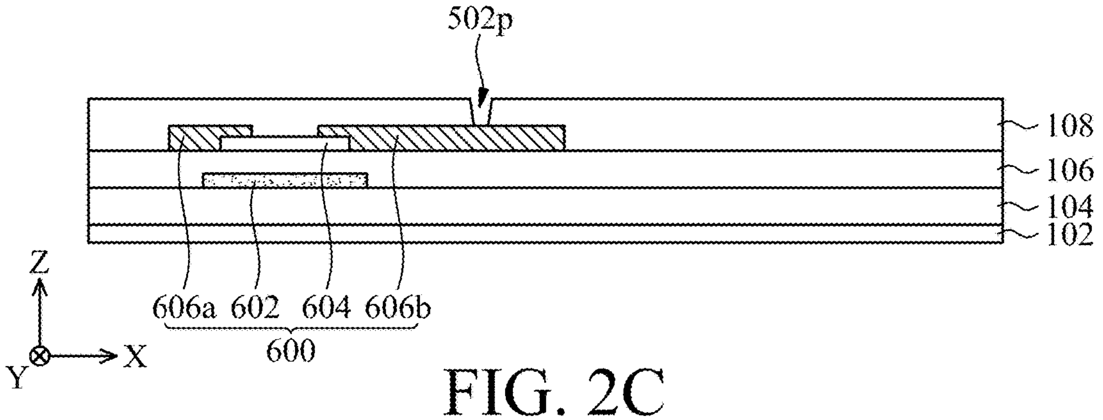

Next, referring to FIG. 2C, in accordance with some embodiments, an opening 502*p* may be formed in the second insulating layer 108, and the opening 502*p* may extend from the top surface of the second insulating layer 108 to the top surface of the source electrode 606*b*. Furthermore, a portion of the source electrode 606*b* may be exposed in the opening 502*p*. In some embodiments, the opening 502*p* may be formed in the second insulating layer 108 by using a patterning process.

Figure 2D:
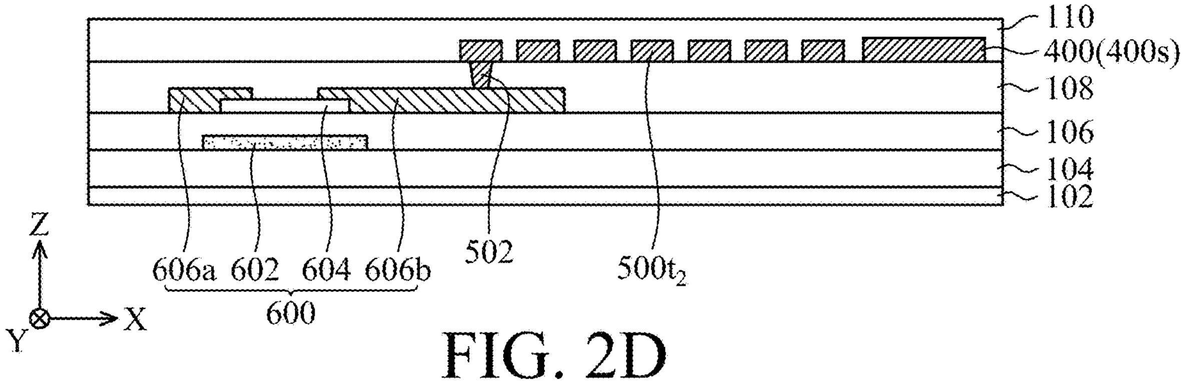

Next, referring to FIG. 2D, in accordance with some embodiments, a conductive material may be filled in the opening 502*p* to form the via 502. In some embodiments, the via 502 may be formed by the physical vapor deposition process, the chemical vapor deposition process, the electroplating process, the electroless plating process, other suitable processes, or a combination thereof.

Next, in accordance with some embodiments, the phase shifter electrode 500 and the feeding structure 400 (feeding line 400*s*) may be formed on the second insulating layer 108, and the phase shifter electrode 500 may be in contact with (or electrically connected to) the via 502. In some embodiments, the phase shifter electrode 500 may partially overlap with the source electrode 606*b* in the normal direction of the first substrate 102 (for example, the Z direction shown in the figure).

In some embodiments, the phase shifter electrode 500 and the feeding structure 400 may be formed by the physical vapor deposition process, the chemical vapor deposition process, the electroplating process, the electroless plating process, other suitable processes, or a combination thereof. In addition, in some embodiments, the phase shifter electrode 500 and the feeding structure 400 may be patterned by a patterning process.

In addition, in some embodiments, the via 502 and the phase shifter electrode 500 may be formed in the same step or different steps. Furthermore, the phase shifter electrode 500 and the feeding structure 400 may also be formed in the same step or different steps.

Next, in accordance with some embodiments, the third insulating layer 110 may be formed on the second insulating layer 108 and cover the phase shifter electrode 500 and the feeding structure 400. Here, the steps of forming the first substrate 102 and the elements thereon are substantially completed. In some embodiments, the third insulating layer 110 may be formed by the physical vapor deposition process, the chemical vapor deposition process, the coating process, other suitable processes, or a combination thereof.

Figure 3:
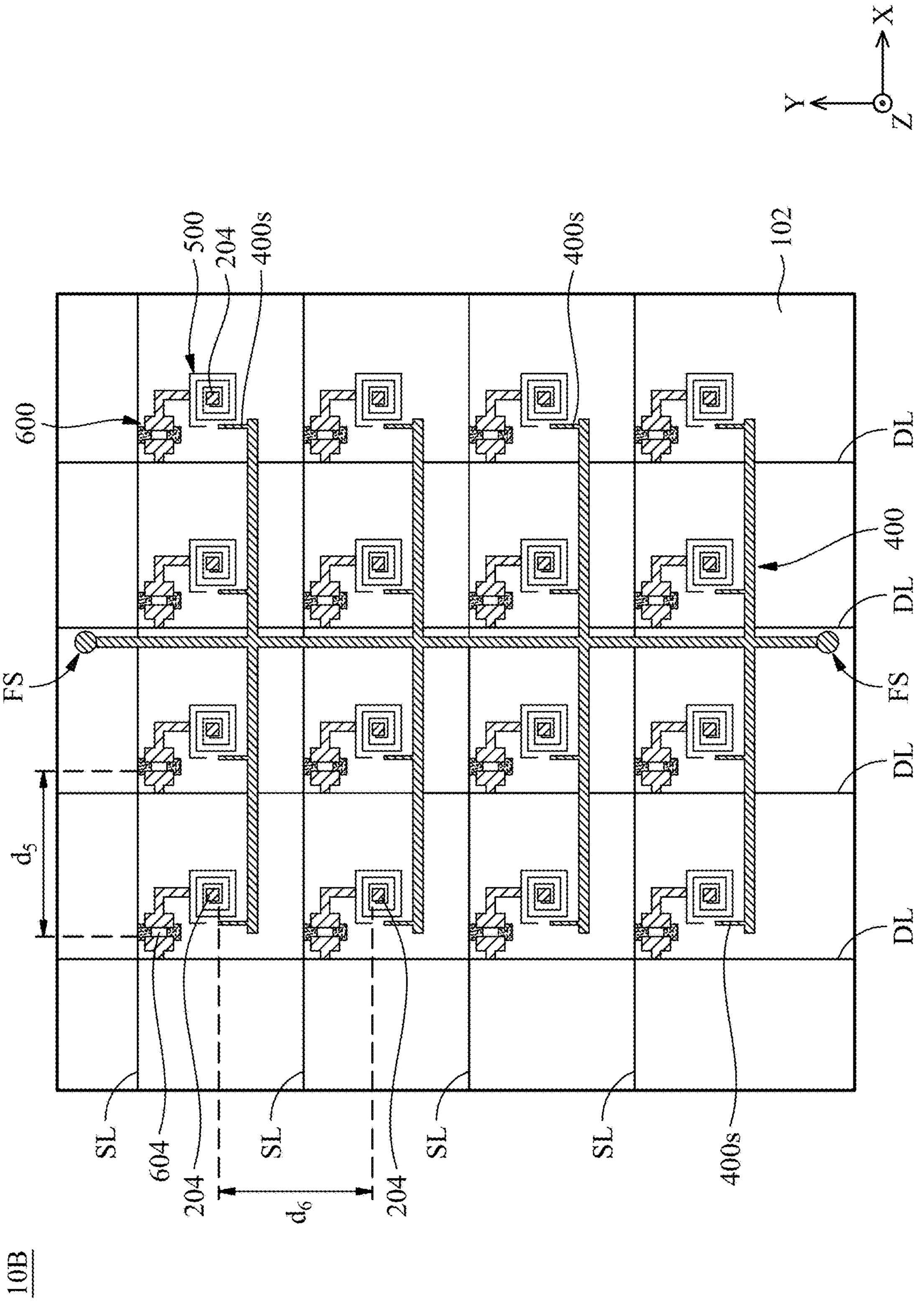
FIG. 3 is a top-view diagram of an electronic device in accordance with some embodiments of the present disclosure.

Next, refer to FIG. 3, which is a top-view diagram of an electronic device 10B in accordance with some other embodiments of the present disclosure. It should be understood that the same or similar components or elements in above and below contexts are represented by the same or similar reference numerals. The materials, manufacturing methods and functions of these components or elements are the same or similar to those described above, and thus will not be repeated herein.

The electronic device 10B shown in FIG. 3 is substantially similar to the electronic device 10A shown in FIG. 1A. The difference between them includes that the feeding structure 400 of the electronic device 10B is further coupled to another feeding source FS. Specifically, in this embodiment, the feeding structure 400 is coupled to two feeding sources FS, and the feeding sources FS can provide feeding waves to the phase shifter electrode 500 in a bidirectional manner.

In addition, as shown in FIG. 3, in some embodiments, the active layers 604 of two adjacent thin film transistors 600 may be separated by a fifth distance $d_5$. In some embodiments, the fifth distance $d_5$ may be in a range from 0.5 times the operating wavelength (2) to 0.8 times the operating wavelength (i.e. 0.5λ≤the fifth distance $d_5$≤0.82), for example, 0.6 times the operating wavelength, or 0.7 times the operating wavelength.

Specifically, in some embodiments, the frequency of the operable radio frequency signal may be in a range from 0.7 GHz to 300 GHz, so the range of the fifth distance $d_5$ may be in a range from 0.1 mm to 300 mm (i.e. 0.1 mm≤fifth distance $d_5$≤300 mm), from 10 mm to 250 mm, or from 50 mm to 200 mm, for example, 100 mm or 150 mm.

It should be understood that, in accordance with some embodiments of the present disclosure, the fifth distance $d_5$ may refer to the distance between the same corresponding positions of two adjacent active layers 604 (i.e. if the leftmost position of an active layer is used, the leftmost position of the other active layer is used; similarly, if the rightmost position of an active layer is used, the rightmost position of the other active layer is used) in a direction that is perpendicular to the normal direction of the first substrate 102 (for example, the X direction or Y direction shown in the figure). Alternatively, in accordance with some embodiments of the present disclosure, the fifth distance $d_5$ may also refer to the distance between the projections of the same positions of two adjacent active layers 604 on the first substrate 102.

In addition, in some embodiments, the two adjacent patch elements 204 may be separated by a sixth distance $d_6$. In some embodiments, the sixth distance $d_6$ may be in a range from 0.5 times the operating wavelength to 0.8 times the operating wavelength (i.e. 0.5λ≤the sixth distance $d_6$≤0.82), for example, 0.6 times the operating wavelength, or 0.7 times the operating wavelength.

Specifically, in some embodiments, the frequency of the operable radio frequency signal is in a range from 0.7 GHz to 300 GHz, so the sixth distance de may be in a range from 0.1 mm to 300 mm (i.e. 0.1 mm≤the sixth distance $d_6$≤300 mm), from 10 mm to 250 mm, or from 50 mm to 200 mm, for example, 100 mm or 150 mm.

It should be understood that in accordance with some embodiments of the present disclosure, the sixth distance do may refer to the minimum distance between the patch elements 204 in a direction that is perpendicular to the normal direction of the first substrate 102 (for example, the X direction or the Y direction shown in the figure). Alternatively, in accordance with some embodiments of the present disclosure, the sixth distance do may also refer to the minimum distance between the projections of two adjacent patch elements 204 on the first substrate 102.

As described above, in accordance with some embodiments, the elements of the modulation unit 100A (e.g., the active layer 604 and the patch element 204 of the thin film transistor 600) that are arranged with a certain distance interval may facilitate the spatial configuration of the electronic device 10B or reduce the risk of coupling between adjacent modulation units 100A.

Figure 4:
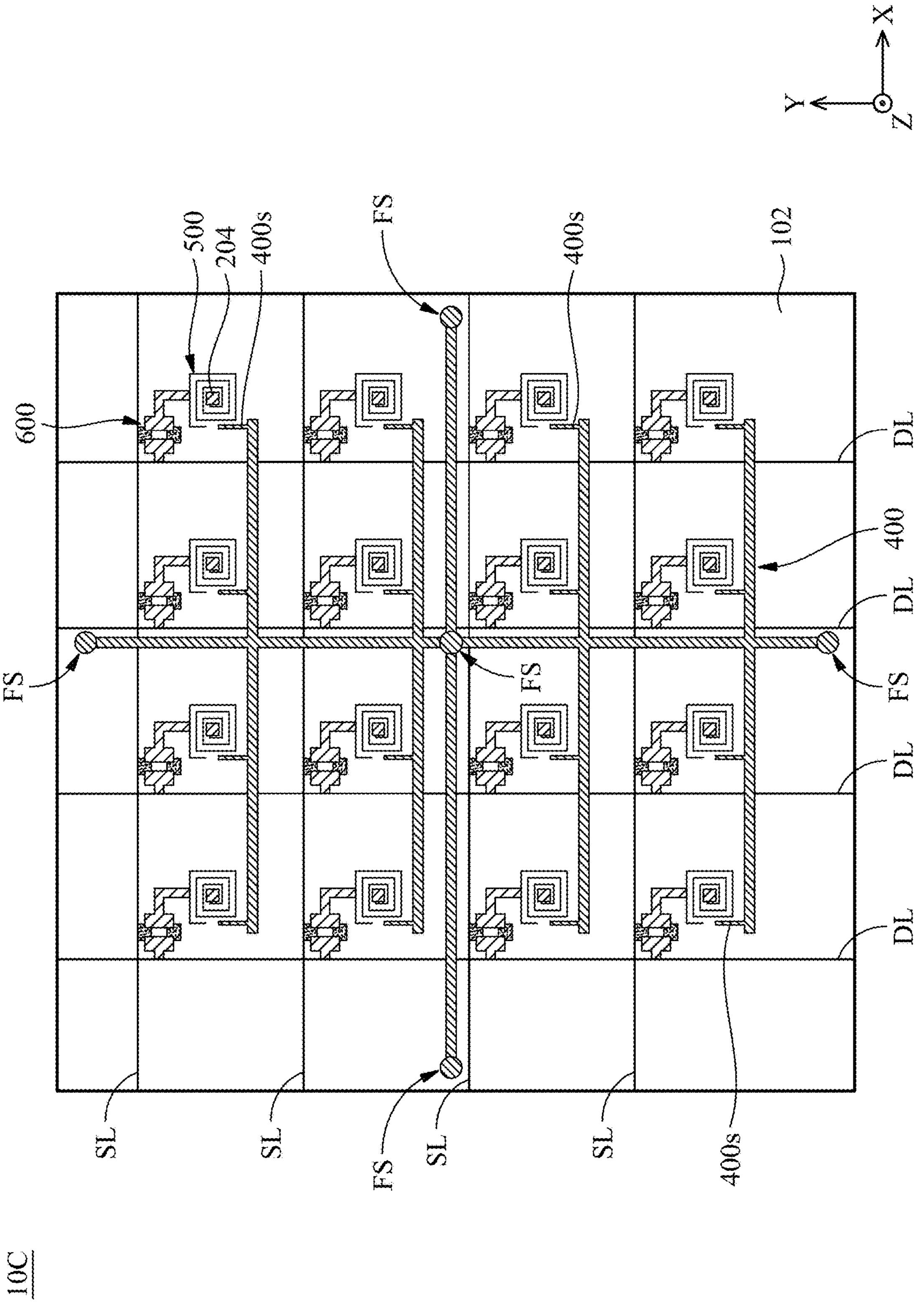
FIG. 4 is a top-view diagram of an electronic device in accordance with some embodiments of the present disclosure.

Next, refer to FIG. 4, which is a top-view diagram of an electronic device 10C in accordance with some other embodiments of the present disclosure. As shown in FIG. 4, in this embodiment, the feeding structure 400 of the electronic device 10C may be coupled to five feeding sources FS. Specifically, in this embodiment, the feeding structure 400 is coupled to two sets of bidirectional feeding sources FS, and is further coupled to a feeding source FS that is located substantially at a central area of the feeding structure 400. In other words, in this embodiment, the feeding structure 400 can provide feeding waves to the phase shifter electrode 500 in a manner of multi-direction combining with a center point.

In some embodiments, the feeding source FS that is located at the center point of the feeding structure 400 and other feeding sources FS may be disposed on different sides of the first substrate 102. In other words, the feeding source FS that is located at the center point of the feeding structure 400 may be disposed on the back side of the first substrate 102. In some embodiments, the feeding structure 400 may be electrically connected to the feeding source FS that is disposed on the back side of the first substrate 102 through a via (not illustrated).

It should be understood that, although the foregoing embodiments only illustrate the aspects in which the feeding structure 400 is coupled to one, two, or five feeding sources FS, the number of the feeding sources FS that is coupled to the feeding structure 400 can be adjusted according to needs in different embodiments.

Next, refer to FIGS. 5A-5D, which are top-view diagrams of the phase shifter electrodes 500 in accordance with some embodiments of the present disclosure. As shown in FIGS. 5A-5D, in some embodiments, the phase shifter electrode 500 may have an irregular shape, and the phase shifter electrode 500 may have a plurality of bending portions BP. For example, in some embodiments, the phase shifter electrode 500 may have a plurality of concave portions and convex portions, spiral-shaped or loop-shaped portions, or a combination thereof, but the present disclosure is not limited thereto.

As shown in FIGS. 5A-5D, the phase shifter electrode 500 may have the end portion 500$t_1$ and the end portion 500$t_2$. In some embodiments, the end portion 500$t_1$ of the phase shifter electrode 500 may extend along the third longitudinal direction $E_3$, and the end portion 500$t_2$ of the phase shifter electrode 500 may extend along the fourth longitudinal direction $E_4$. In some embodiments, the third longitudinal direction $E_3$ may be substantially perpendicular to the fourth longitudinal direction $E_4$ (e.g., the embodiments shown in FIGS. 5A and 5C) or the third longitudinal direction $E_3$ may be substantially parallel to the fourth longitudinal direction $E_4$ (e.g., the embodiments shown in FIGS. 5B and 5D), but it is not limited thereto. In some other embodiments, an included angle (not illustrated) between the third longitudinal direction $E_3$ and the fourth longitudinal direction $E_4$ may be in a range from 5 degrees to 270 degrees, from 35 degrees to 240 degrees, from 60 degrees to 210 degrees, or from 70 degrees to 200 degrees.

Furthermore, in some embodiments, the phase shifter electrode 500 may have a length L. In some embodiments, the length L of the phase shifter electrode 500 may be in a range from 0.5 times the operating wavelength to 0.8 times the operating wavelength (i.e. 0.5λ≤the length L≤0.82), for example, 0.6 times the operating wavelength, or 0.7 times the operating wavelength.

Specifically, in some embodiments, the frequency of the operable radio frequency signal may be in a range from 0.7 GHZ to 300 GHz, so the range of the length L may be in a range from 0.1 mm to 300 mm (i.e. 0.1 mm≤the length L≤300 mm), from 10 mm to 250 mm, or from 50 mm to 200 mm, for example, 100 mm or 150 mm.

In accordance with some embodiments of the present disclosure, for the phase shifter electrode 500 having a rectangular, elliptical, or elongated shape as a whole, the length L may be defined as its maximum dimension in the longitudinal direction (for example, the Y direction shown in FIGS. 5A-5D). For the phase shifter electrode 500 not having a definite long axis, the length L may be defined as the long side of the smallest rectangle that can surround the phase shifter electrode 500.

Furthermore, in some embodiments, the phase shifter electrode 500 may have a width W. In some embodiments, the width W of the phase shifter electrode 500 may be in a range from 0.5 times the operating wavelength to 0.8 times the operating wavelength (i.e. 0.5λ≤the width W≤0.82), for example, 0.6 times the operating wavelength, or 0.7 times the operating wavelength.

Specifically, in some embodiments, the frequency of the operable radio frequency signal may be in a range from 0.7 GHz to 300 GHz, so the width W may be in a range from 0.1 mm to 300 mm (i.e. 0.1 mm≤the width W≤300 mm), from 10 mm to 250 mm, or from 50 mm to 200 mm, for example, 100 mm or 150 mm.

Similarly, in accordance with some embodiments of the present disclosure, for the phase shifter electrode 500 having a rectangular, elliptical, or elongated shape as a whole, the width W may be defined as its maximum dimension in the lateral direction (for example, the X direction shown in FIGS. 5A-5D). For the phase shifter electrode 500 not having a definite short axis, the width W may be defined as the short side of the smallest rectangle that can surround the phase shifter electrode 500.

Figure 5A:
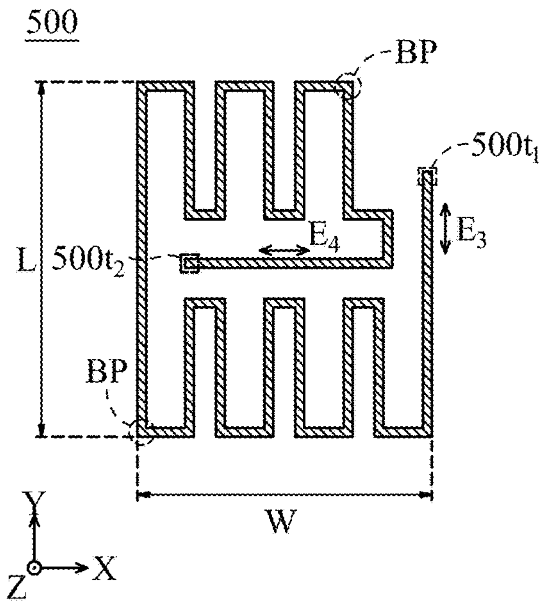
FIGS. 5A-5D are top-view diagrams of phase shifter electrodes of an electronic device in accordance with some embodiments of the present disclosure.
Figure 5B:
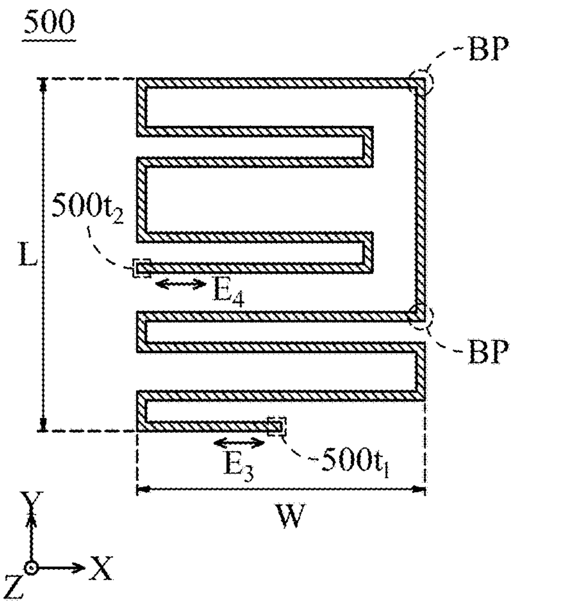
Figure 5C:
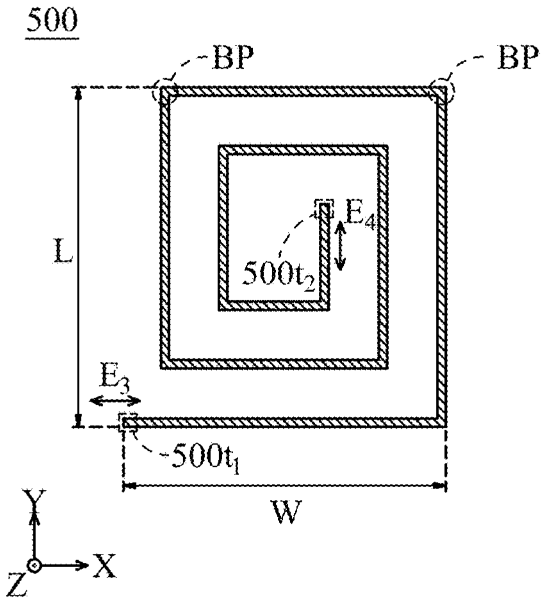
Figure 5D:
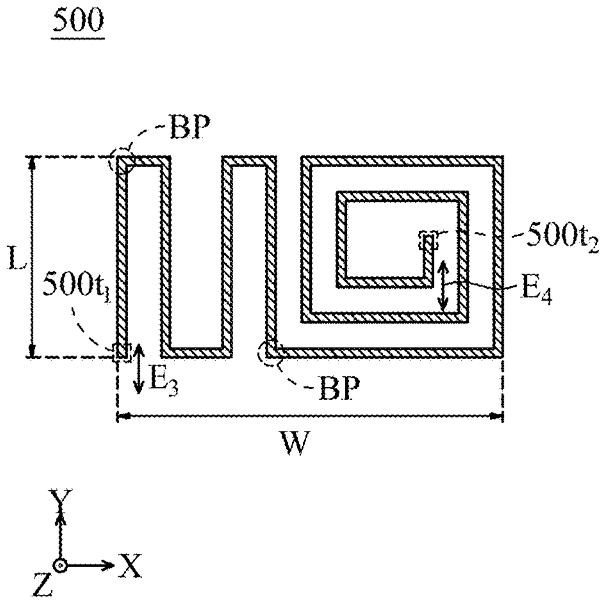

Moreover, in some embodiments, the total length of the phase shifter electrode 500 (i.e. the total length from the end portion 500$t_1$ to the end portion 500$t_2$) may be in a range from 5 mm to 2100 mm, from 100 mm to 2000 mm, or from 500 mm to 1500 mm. In addition, as shown in FIG. 5C, in some embodiments, the phase shifter electrode 500 may have a plurality of loops. In such embodiments, the number of the loops may be in a range from 1 to 20 laps, from 3 to 18 laps, or from 5 to 15 laps, for example, 6 laps, 8 laps, 10 laps, 12 laps, or 14 laps.

Figure 6:
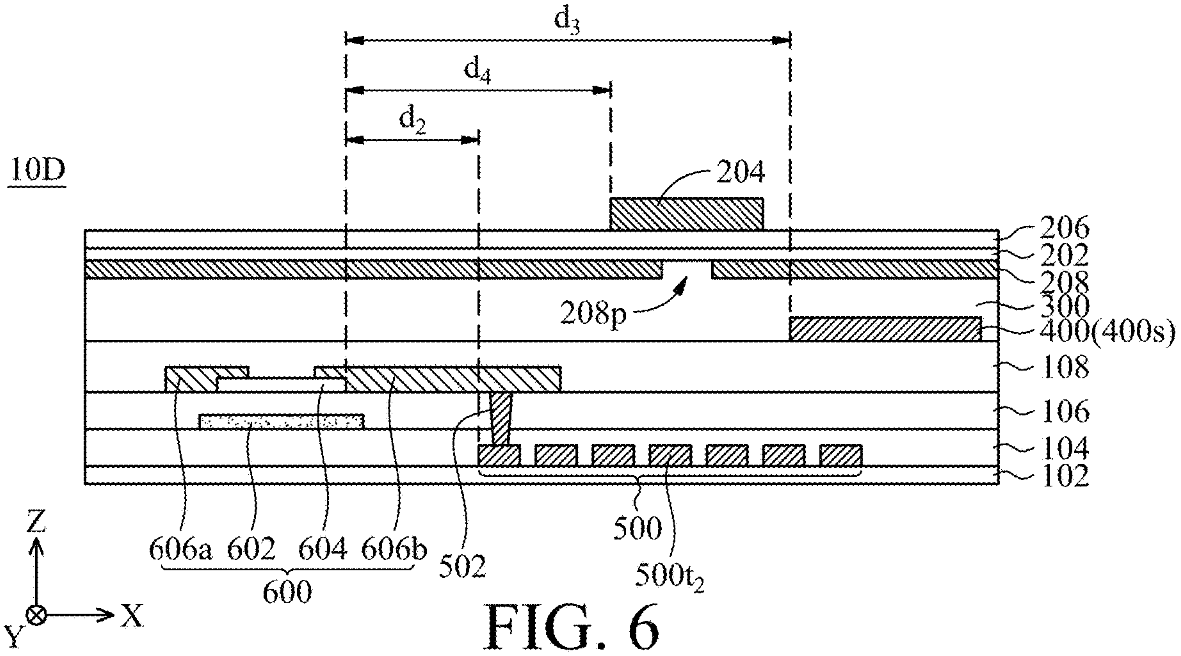
FIG. 6 is a cross-sectional diagram of an electronic device in accordance with some embodiments of the present disclosure.

Next, refer to FIG. 6, which is a cross-sectional diagram of an electronic device 10D in accordance with some other embodiments of the present disclosure. As shown in FIG. 6, in some embodiments, the feeding structure 400 and the phase shifter electrode 500 may be disposed at different levels (on different layers) in the cross-sectional structure. Specifically, in this embodiment, the phase shifter electrode 500 may be disposed on the first substrate 102 and between the first substrate 102 and the first insulating layer 106, and the feeding structure 400 may be disposed on the second insulating layer 108.

In this embodiment, the phase shifter electrode 500 and the drain electrode 606*a*, the source electrode 606*b*, and the gate electrode 602 of the thin film transistor 600 may be disposed on different layers. In this embodiment, the phase shifter electrode 500 may be electrically connected to the source electrode 606*b* of the thin film transistor 600 through the via 502. In addition, in this embodiment, in the normal direction of the first substrate 102 (for example, the Z direction shown in the figure), the feeding structure 400 may partially overlap with the phase shifter electrode 500.

Figure 7:
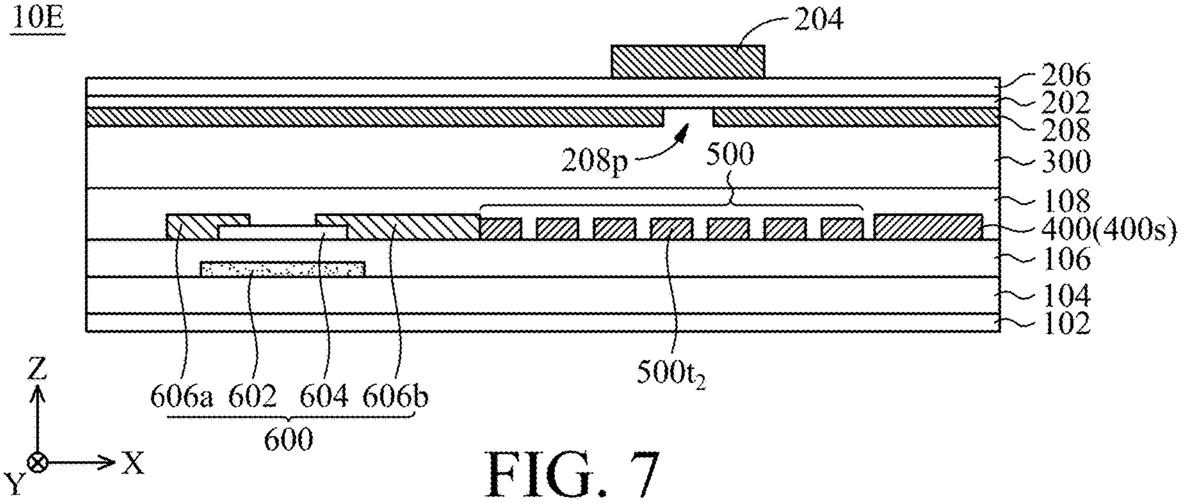
FIG. 7 is a cross-sectional diagram of an electronic device in accordance with some embodiments of the present disclosure.

Next, refer to FIG. 7, which is a cross-sectional diagram of an electronic device 10E in accordance with some other embodiments of the present disclosure. As shown in FIG. 7, in some embodiments, the feeding structure 400 and the phase shifter electrode 500 may be disposed at the same level (on the same layer) in the cross-sectional structure. In this embodiment, the phase shifter electrode 500 may also be disposed on the same layer as the drain electrode 606*a* and the source electrode 606*b* of the thin film transistor 600. In some embodiments, the phase shifter electrode 500 may also be disposed on the same layer as the scan line SL and/or the data line DL (not illustrated). In addition, in this embodiment, the phase shifter electrode 500 may be in contact with the source electrode 606*b*.

Figure 8:
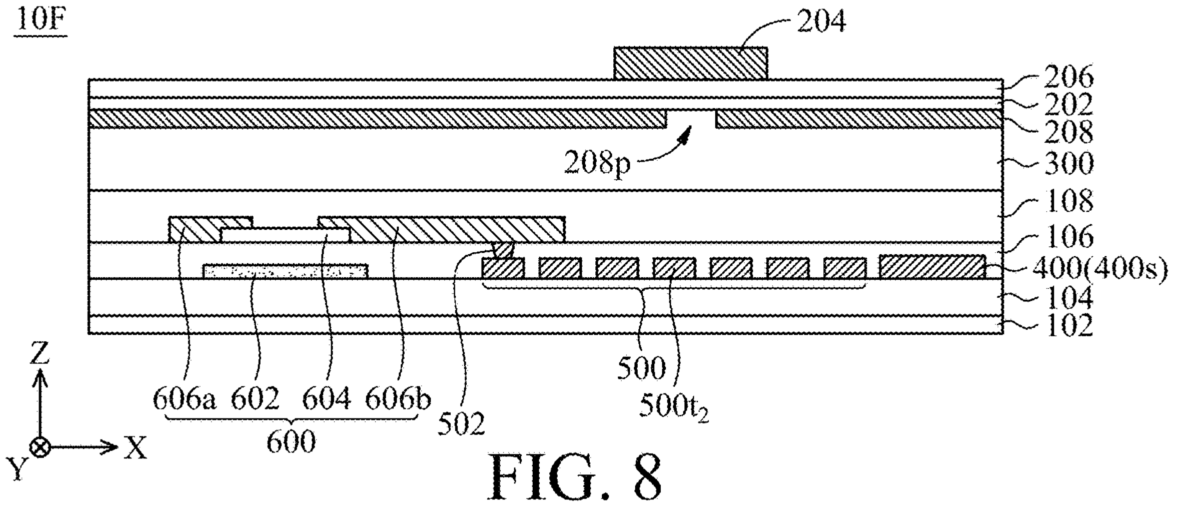
FIG. 8 is a cross-sectional diagram of an electronic device in accordance with some embodiments of the present disclosure.

Next, refer to FIG. 8, which is a cross-sectional diagram of an electronic device 10F in accordance with some other embodiments of the present disclosure. As shown in FIG. 8, in some embodiments, the feeding structure 400 and the phase shifter electrode 500 may be disposed on the same layer in the cross-sectional structure. In this embodiment, the phase shifter electrode 500 may also be disposed on the same layer as the gate electrode 602 of the thin film transistor 600. In this embodiment, the phase shifter electrode 500 and the drain electrode 606*a* and the source electrode 606*b* of the thin film transistor 600 may be disposed on different layers. In this embodiment, the phase shifter electrode 500 may be electrically connected to the source electrode 606*b* of the thin film transistor 600 through the via 502.

Figure 9:
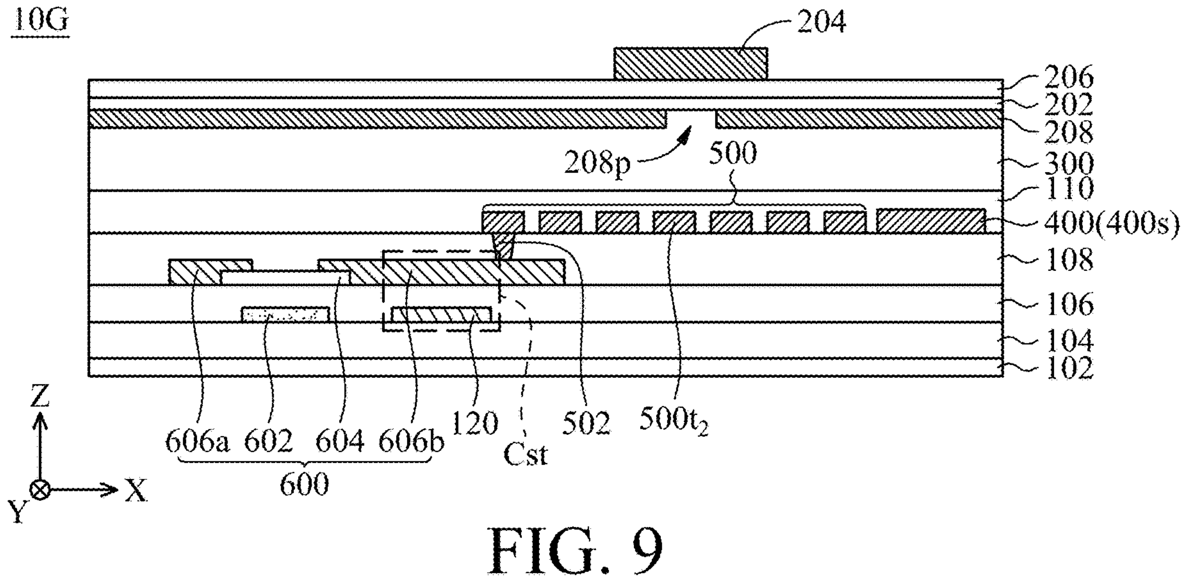
FIG. 9 is a cross-sectional diagram of an electronic device in accordance with some embodiments of the present disclosure.

Next, refer to FIG. 9, which is a cross-sectional diagram of an electronic device 10G in accordance with some other embodiments of the present disclosure. The electronic device 10G shown in FIG. 9 is substantially similar to the electronic device 10A shown in FIG. 1C. The difference between them includes that the electronic device 10G may further include a storage capacitor Cst, and the storage capacitor Cst may be electrically connected to the phase shifter electrode 500.

Specifically, as shown in FIG. 9, in this embodiment, the electronic device 10G may further include a first conductive element 120, and the first conductive element 120 may be disposed on the buffer layer 104 and overlap with the source electrode 606*b* in the normal direction of the first substrate 102. In addition, in this embodiment, the first conductive element 120 may be grounded. In this embodiment, the first conductive element 120, the source electrode 606*b*, and the first insulating layer 106 disposed between the first conductive element 120 and the source electrode 606*b* may serve as the storage capacitor Cst.

In some embodiments, the material of the first conductive element 120 may include a conductive material. The conductive material may include copper (Cu), silver (Ag), tin (Sn), aluminum (Al), molybdenum (Mo), tungsten (W), gold (Au), chromium (Cr), nickel (Ni), platinum (Pt), titanium (Ti), copper alloy, silver alloy, tin alloy, aluminum alloy, molybdenum alloy, tungsten alloy, gold alloy, chromium alloy, nickel alloy, platinum alloy, titanium alloy, other suitable conductive materials, or a combination thereof, but it is not limited thereto.

Figure 10A:
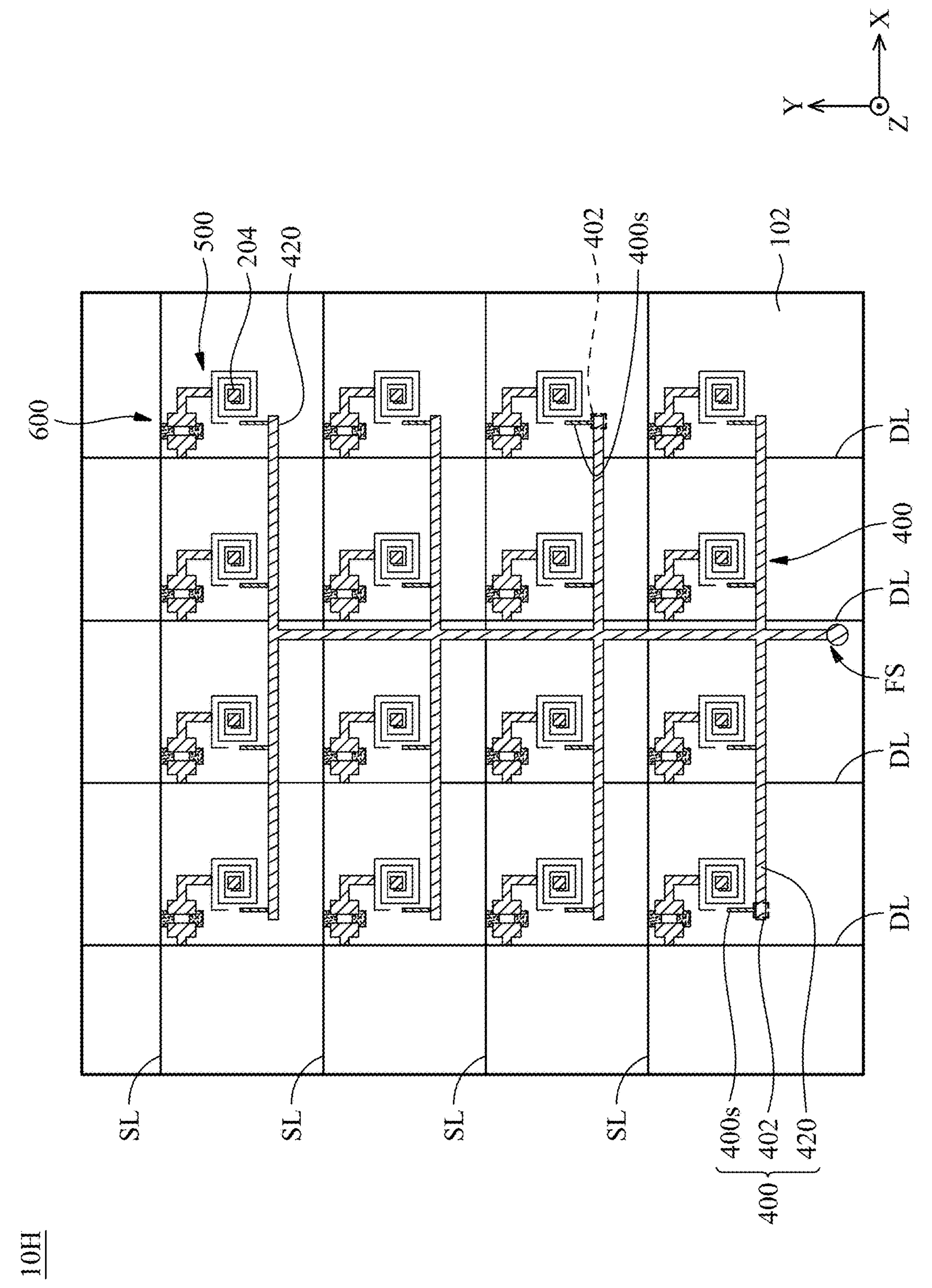
FIG. 10A is a top-view diagram of an electronic device in accordance with some embodiments of the present disclosure.
Figure 10B:
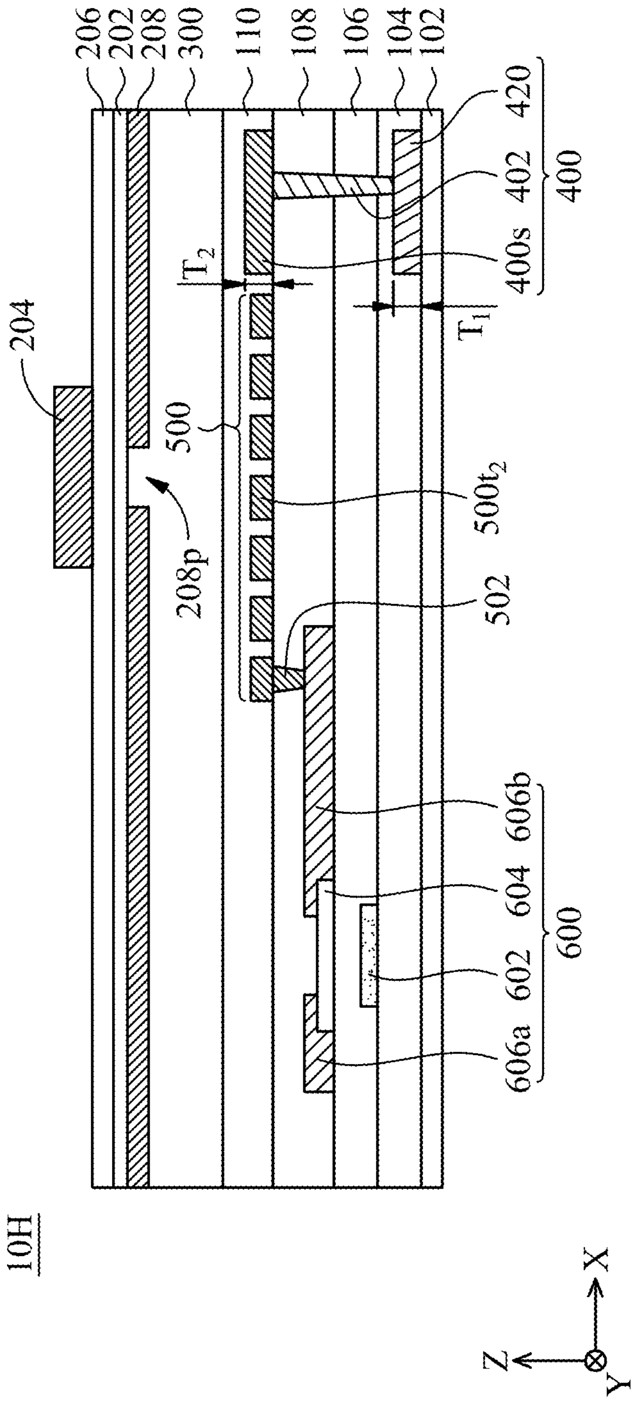
FIG. 10B is a cross-sectional diagram of an electronic device in accordance with some embodiments of the present disclosure.

Next, refer to FIGS. 10A and 10B. FIG. 10A is a top-view diagram of an electronic device 10H in accordance with some other embodiments of the present disclosure, and FIG. 10B is a cross-sectional diagram of the electronic device 10H in accordance with some embodiments of the present disclosure. As shown in FIGS. 10A and 10B, in this embodiment, the feeding structure 400 may include the feeding line 400*s*, a via 402, and a second conductive element 420. In this embodiment, the feeding structure 400 may be a non-single-layer conductive structure.

Specifically, as shown in FIG. 10B, the feeding line 400*s* and the phase shifter electrode 500 may be disposed on the same layer, and the feeding line 400*s* may be electrically connected to the second conductive element 420 through the via 402, and the second conductive element 420 may be disposed on the first substrate 102 or on the buffer layer 104, but it is not limited thereto. In this embodiment, the second conductive element 420 may have a first thickness $T_1$, and the feeding line 400*s* may have a second thickness $T_2$. In this embodiment, the first thickness $T_1$ of the second conductive element 420 may be greater than or equal to the second thickness $T_2$ of the feeding line 400*s*. In addition, in this embodiment, the conductivity of the second conductive element 420 may be greater than or equal to the conductivity of the feeding line 400*s*.

Furthermore, in accordance with the embodiments of the present disclosure, the thickness of the second conductive element 420 and the feeding line 400*s* may refer to the maximum thickness of the second conductive element 420 and the feeding line 400 in the normal direction of the first substrate 102 (for example, the Z direction shown in the figure).

In addition, in accordance with the embodiments of the present disclosure, an optical microscopy (OM), a scanning electron microscope (SEM), a thin film thickness profiler (α-step), an ellipse thickness gauge, or other suitable means to measure the thickness of each component. Specifically, in some embodiments, after the liquid crystal layer 300 is removed, the scanning electron microscope can be used to obtain any cross-sectional image of the structure, and the thickness of each element in the image can be measured.

In some embodiments, the material of the second conductive element 420 may include a conductive material. The conductive material may include copper (Cu), silver (Ag), tin (Sn), aluminum (Al), molybdenum (Mo), tungsten (W), gold (Au), chromium (Cr), nickel (Ni), platinum (Pt), titanium (Ti), copper alloy, silver alloy, tin alloy, aluminum alloy, molybdenum alloy, tungsten alloy, gold alloy, chromium alloy, nickel alloy, platinum alloy, titanium alloy, other suitable conductive materials, or a combination thereof, but it is not limited thereto. In addition, the material of the second conductive element 420 may be the same as or different from the material of the feeding line 400*s* or the via 402.

In this embodiment, a portion of the structure of the feeding structure 400 such as the second conductive element 420 may be disposed on the lower layer (e.g., on the first substrate 102), and another portion of the structure of the feeding structure 400 such as the feeding line 400*s* may be disposed on the upper layer (e.g., on the second insulating layer 108), thereby reducing the energy dissipation of the electronic device 10H.

Next, refer to FIGS. 11A-11F, which are cross-sectional diagrams of the electronic device 10H during the manufacturing process in accordance with some embodiments of the present disclosure. Specifically, FIGS. 11A-11F illustrate the steps of forming a portion of the elements (elements that are formed on the first substrate 102) of the electronic device 10H. It should be understood that in accordance with some embodiments, additional operation steps may be provided before, during and/or after the manufacturing process of the electronic device 10H is performed. In accordance with some embodiments, some of the operation steps may be replaced or omitted. In accordance with some embodiments, the order of the operation steps may be interchangeable.

Figure 11A:
FIGS. 11A-11F are cross-sectional diagrams of an electronic device during the manufacturing process in accordance with some embodiments of the present disclosure.

Referring to FIG. 11A, in some embodiments, the first substrate 102 may be provided, and then the second conductive element 420 may be formed on the first substrate 102 or the buffer layer 104, but it is not limited thereto. In some embodiments, the second conductive element 420 may be formed by a physical vapor deposition process, a chemical vapor deposition process, an electroplating process, an electroless plating process, other suitable processes, or a combination thereof. In addition, in some embodiments, the second conductive element 420 may be patterned by a patterning process.

Next, the buffer layer 104 may be formed on the first substrate 102 and cover the second conductive element 420. In some embodiments, the buffer layer 104 may be formed by a physical vapor deposition process, a chemical vapor deposition process, a coating process, other suitable processes, or a combination thereof.

Next, in accordance with some embodiments, the gate electrode 602 may be formed on the buffer layer 104. In some embodiments, the scan line SL (not illustrated) may be formed simultaneously in the step of forming the gate electrode 602. In some embodiments, the gate electrode 602 and/or the scan line SL may be formed by the physical vapor deposition process, the chemical vapor deposition process, the electroplating process, the electroless plating process, other suitable processes, or a combination thereof. In addition, in some embodiments, the gate electrode 602 and/or the scan line SL may be patterned by a patterning process.

Next, in accordance with some embodiments, the first insulating layer 106 may be formed on the gate electrode 602 to cover the gate electrode 602. In some embodiments, the first insulating layer 106 may be formed by the physical vapor deposition process, the chemical vapor deposition process, the coating process, other suitable processes, or a combination thereof.

Figure 11B:

Thereafter, as shown in FIG. 11B, in accordance with some embodiments, the active layer 604, the drain electrode 606*a*, and the source electrode 606*b* may be formed on the first insulating layer 106. In some embodiments, the active layer 604 may overlap with the gate electrode 602 in a normal direction of the first substrate 102 (for example, the Z direction shown in the figure). Furthermore, the drain electrode 606*a* and the source electrode 606*b* may be disposed on both sides of the active layer 604, and the drain electrode 606*a* and the source electrode 606*b* may partially cover the active layer 604. Here, the steps of forming the thin film transistor 600 is substantially completed.

In some embodiments, the active layer 604, the drain electrode 606*a*, and the source electrode 606*b* may be formed by the physical vapor deposition process, the chemical vapor deposition process, the electroplating process, the electroless plating process, other suitable processes, or a combination thereof. In addition, in some embodiments, the drain electrode 606*a* and the source electrode 606*b* may be patterned by a patterning process.

Figure 11C:
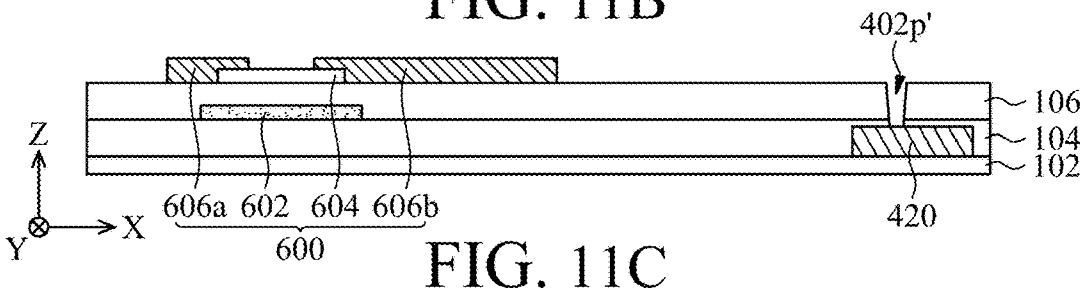

Next, referring to FIG. 11C, in accordance with some embodiments, an opening 402*p*' may be formed in the first insulating layer 106 and the buffer layer 104, and the openings 402*p*' may extend from the top surface of the first insulating layer 106 through the buffer layer 104 to the top surface of the second conductive element 420. Moreover, the opening 402*p*' may expose a portion of the second conductive element 420. In some embodiments, the opening 402*p*' may be formed in the first insulating layer 106 and the buffer layer 104 by a patterning process.

Figure 11D:
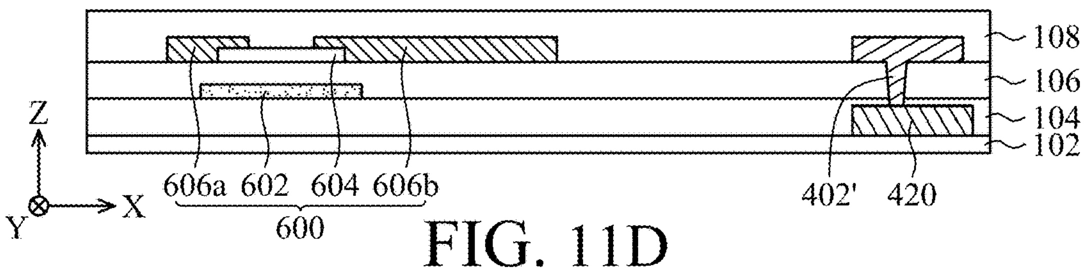

Next, referring to FIG. 11D, in accordance with some embodiments, a conductive material may be filled in the opening 402*p*' to form a via 402'. In some embodiments, the drain electrode 606*a* and the source electrode 606*b* may be formed together with the via 402' by a patterning process. Furthermore, the material for forming the drain electrode 606*a* and the source electrode 606*b* may be the same as or different from the material for forming the via 402'. In some embodiments, the via 402' may be formed by the physical vapor deposition process, the chemical vapor deposition process, the electroplating process, the electroless plating process, other suitable processes, or a combination thereof.

In accordance with some embodiments, the second insulating layer 108 may be formed on the first insulating layer 106 to cover the active layer 604, the drain electrode 606*a*, the source electrode 606*b*, and the via 402'. In some embodiments, the second insulating layer 108 may be formed by the physical vapor deposition process, the chemical vapor deposition process, the coating process, other suitable processes, or a combination thereof.

Figure 11E:
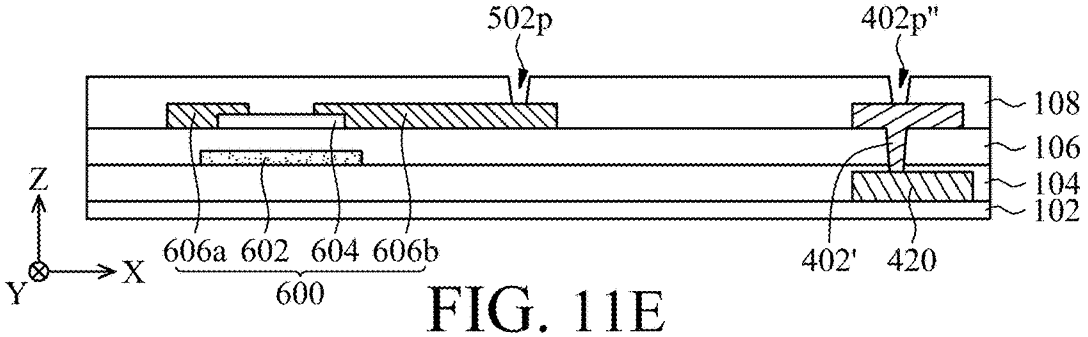

Next, referring to FIG. 11E, in accordance with some embodiments, the opening 502*p* and opening 402*p*" may be formed in the second insulating layer 108. The opening 502*p* may extend from the top surface of the second insulating layer 108 to the top surface of the source electrode 606*b*. The opening 402*p*" may extend from the top surface of the second insulating layer 108 to the top surface of the via 402'. Furthermore, the opening 502*p* may expose a portion of the source electrode 606*b*, and the opening 402*p*" may expose a portion of the via 402'. In some embodiments, the opening 502*p* and the opening 402*p*" may be formed in the second insulating layer 108 by a patterning process.

Figure 11F:
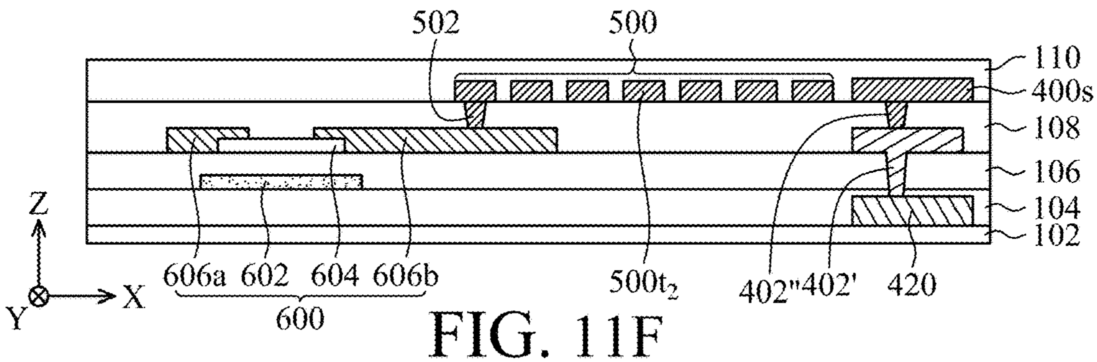

Next, referring to FIG. 11F, in accordance with some embodiments, the conductive material may be filled in the opening 502*p* and the opening 402*p*" to form the via 502 and the via 402", respectively. Furthermore, the material for forming the via 502 may be the same as or different from the material for forming the via 402". In some embodiments, the via 502 and the via 402" may be formed by the physical vapor deposition process, the chemical vapor deposition process, the electroplating process, the electroless plating process, other suitable processes, or a combination thereof.

Next, in accordance with some embodiments, the phase shifter electrode 500 and the feeding structure 400 (the feeding line 400*s*) may be formed on the second insulating layer 108, and the phase shifter electrode 500 may be in contact with the via 502, and the feeding line 400*s* may be in contact with the via 402". In some embodiments, in the normal direction of the first substrate 102 (for example, the Z direction shown in the figure), the phase shifter electrode 500 may partially overlap with the source electrode 606*b*. In some embodiments, the phase shifter electrode 500 may be formed together with the feeding line 400*s* by a patterning process. In addition, the material for forming the phase shifter electrode 500 and the feeding line 400*s* may be the same as or different from the material for forming the via 402".

In some embodiments, the phase shifter electrode 500 and the feeding structure 400 may be formed by the physical vapor deposition process, the chemical vapor deposition process, the electroplating process, the electroless plating process, other suitable processes, or a combination thereof. In addition, in some embodiments, the phase shifter electrode 500 and the feeding structure 400 may be patterned by a patterning process.

It should be understood that, in this embodiment, the via structure for electrically connecting the feeding line 400*s* and the second conductive element 420 has a double-layer structure, i.e. the via 402' and the via 402". However, in some other embodiments, the via structure for electrically connecting the feeding line 400*s* and the second conductive element 420 may have a single-layer structure, e.g., the via 402 shown in FIG. 10B. In the embodiments where the via structure has a single-layer structure, the via that extends from the top surface of the second insulating layer 108 to the top surface of the second conductive element 420 may be formed in a single step.

Moreover, in some embodiments, the via 502 and the phase shifter electrode 500 may be formed in the same step or different steps. In some embodiments, the via 402" and the feeding structure 400 may be formed in the same step or different steps. Furthermore, the phase shifter electrode 500 and the feeding structure 400 may also be formed in the same step or different steps.

Next, in accordance with some embodiments, the third insulating layer 110 may be formed on the second insulating layer 108 and cover the phase shifter electrode 500 and the feeding structure 400. Here, the steps for forming the first substrate 102 and the elements thereon are substantially completed. In some embodiments, the third insulating layer 110 may be formed by the physical vapor deposition process, the chemical vapor deposition process, the coating process, other suitable processes, or a combination thereof.

Figure 12:
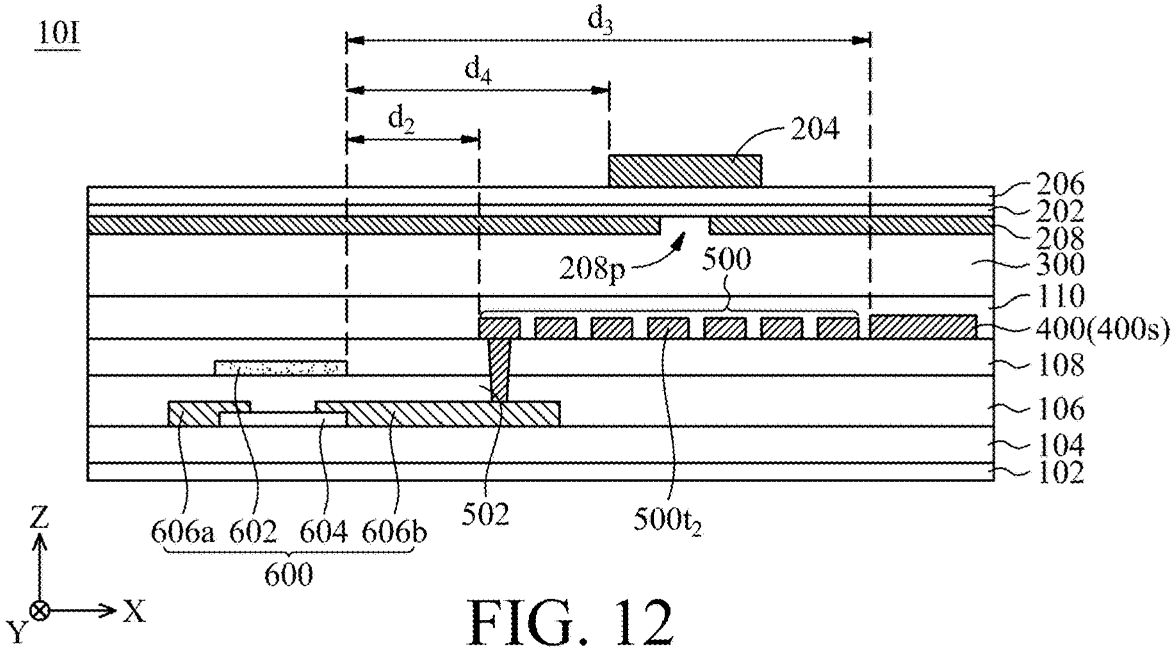
FIG. 12 is a cross-sectional diagram of an electronic device in accordance with some embodiments of the present disclosure.

Next, refer to FIG. 12, which is a cross-sectional diagram of an electronic device 10I in accordance with some embodiments of the present disclosure. The electronic device 10I shown in FIG. 12 is substantially similar to the electronic device 10A shown in FIG. 1C. The difference between them includes that the thin film transistor 600 in the electronic device 10A is a thin film transistor with bottom gate, and the thin film transistor 600 in the electronic device 10I is a thin film transistor with top gate.

Specifically, as shown in FIG. 12, in this embodiment, the feeding structure 400 and the phase shifter electrode 500 may be disposed on the same layer in the cross-sectional structure. In this embodiment, both the feeding structure 400 and the phase shifter electrode 500 may be disposed on the second insulating layer 108. In this embodiment, the phase shifter electrode 500 may be disposed on different layers from the drain electrode 606*a*, the source electrode 606*b*, and the gate electrode 602 of the thin film transistor 600. In this embodiment, the phase shifter electrode 500 may be electrically connected to the source electrode 606*b* of the thin film transistor 600 through the via 502.

Figure 13:
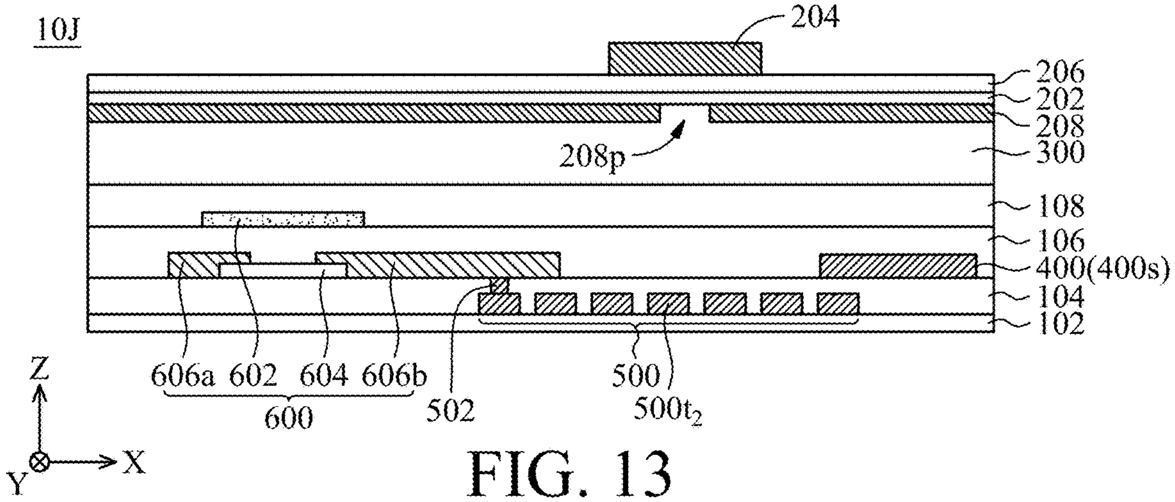
FIG. 13 is a cross-sectional diagram of an electronic device in accordance with some embodiments of the present disclosure.

Next, refer to FIG. 13, which is a cross-sectional diagram of an electronic device 10J in accordance with some embodiments of the present disclosure. As shown in FIG. 13, in this embodiment, the thin film transistor 600 may be a top gate thin film transistor. In this embodiment, the feeding structure 400 and the phase shifter electrode 500 may be disposed on different layers in the cross-sectional structure. Specifically, in this embodiment, the phase shifter electrode 500 may be disposed on the first substrate 102, and the feeding structure 400 may be disposed on the buffer layer 104.

In this embodiment, the drain electrode 606*a*, the source electrode 606*b*, and the gate electrode 602 of the thin film transistor 600 are disposed on different layers from the phase shifter electrode 500. In this embodiment, the phase shifter electrode 500 may be electrically connected to the source electrode 606*b* of the thin film transistor 600 through the via 502. In addition, in this embodiment, in the normal direction of the first substrate 102 (for example, the Z direction shown in the figure), the feeding structure 400 may partially overlap with the phase shifter electrode 500.

Figure 14:
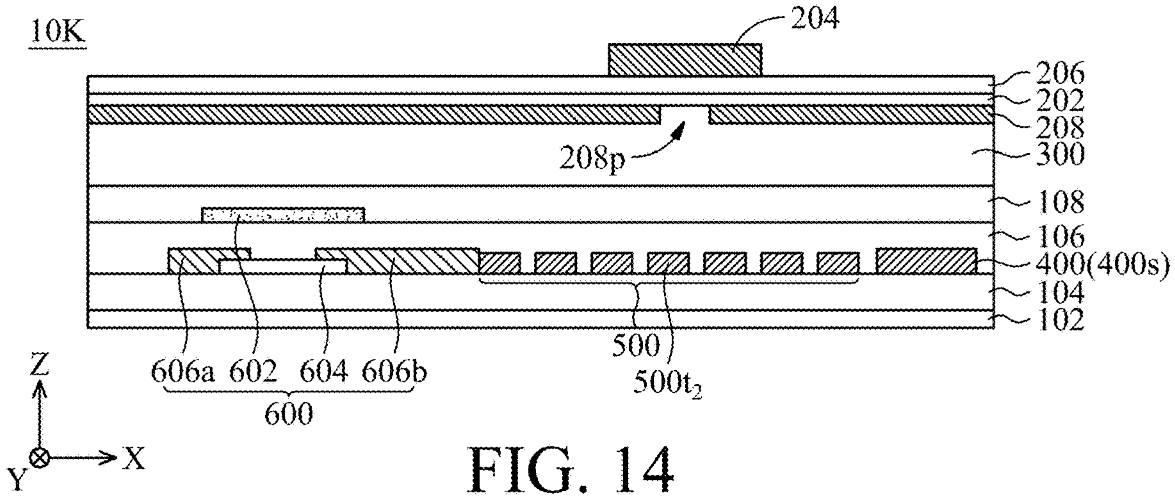
FIG. 14 is a cross-sectional diagram of an electronic device in accordance with some embodiments of the present disclosure.

Next, refer to FIG. 14, which is a cross-sectional diagram of an electronic device 10K in accordance with some embodiments of the present disclosure. As shown in FIG. 14, in this embodiment, the thin film transistor 600 may be a top gate thin film transistor. In this embodiment, the feeding structure 400 and the phase shifter electrode 500 may be disposed on the same layer in the cross-sectional structure. Specifically, in this embodiment, both the phase shifter electrode 500 and the feeding structure 400 may be disposed on the buffer layer 104.

In this embodiment, the phase shifter electrode 500 may also be disposed on the same layer as the drain electrode 606*a* and the source electrode 606*b* of the thin film transistor 600. In some embodiments, the phase shifter electrode 500 may also be disposed on the same layer as the scan line SL and/or the data line DL (not illustrated). In addition, in this embodiment, the phase shifter electrode 500 may be in contact with the source electrode 606*b*.

Figure 15:
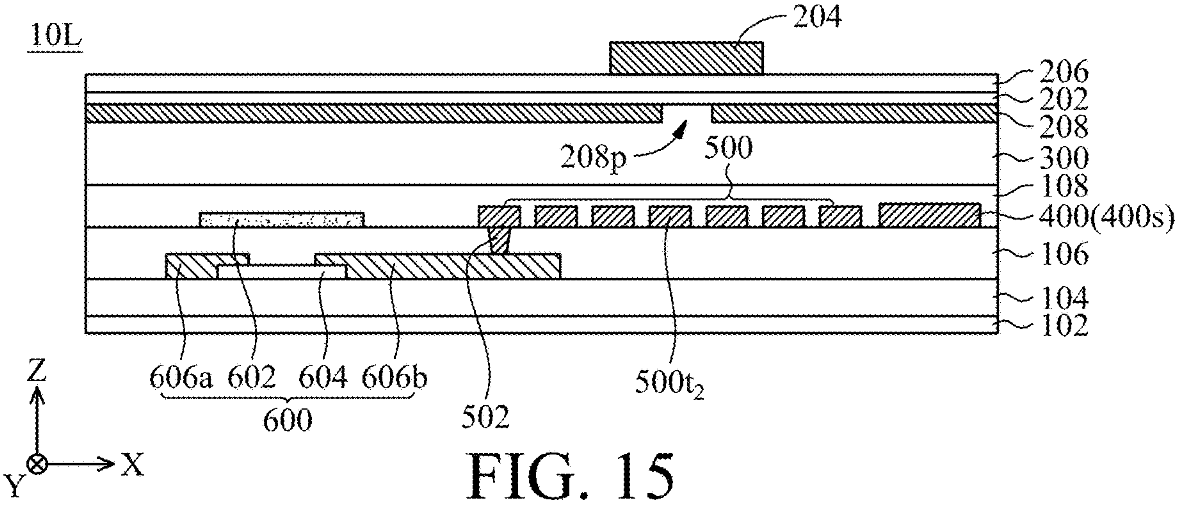
FIG. 15 is a cross-sectional diagram of an electronic device in accordance with some embodiments of the present disclosure.

Next, refer to FIG. 15, which is a cross-sectional diagram of an electronic device 10L in accordance with some embodiments of the present disclosure. As shown in FIG. 15, in this embodiment, the thin film transistor 600 may be a thin film transistor with top gate. In this embodiment, the feeding structure 400 and the phase shifter electrode 500 may be disposed on the same layer in the cross-sectional structure. Specifically, in this embodiment, both the phase shifter electrode 500 and the feeding structure 400 may be disposed on the first insulating layer 106.

In this embodiment, the phase shifter electrode 500 may also be disposed on the same layer as the gate electrode 602 of the thin film transistor 600. In this embodiment, the drain electrode 606*a* and the source electrode 606*b* of the thin film transistor 600 may be disposed on different layers from the phase shifter electrode 500. In this embodiment, the phase shifter electrode 500 may be electrically connected to the source electrode 606*b* of the thin film transistor 600 through the via 502.

Figure 16:
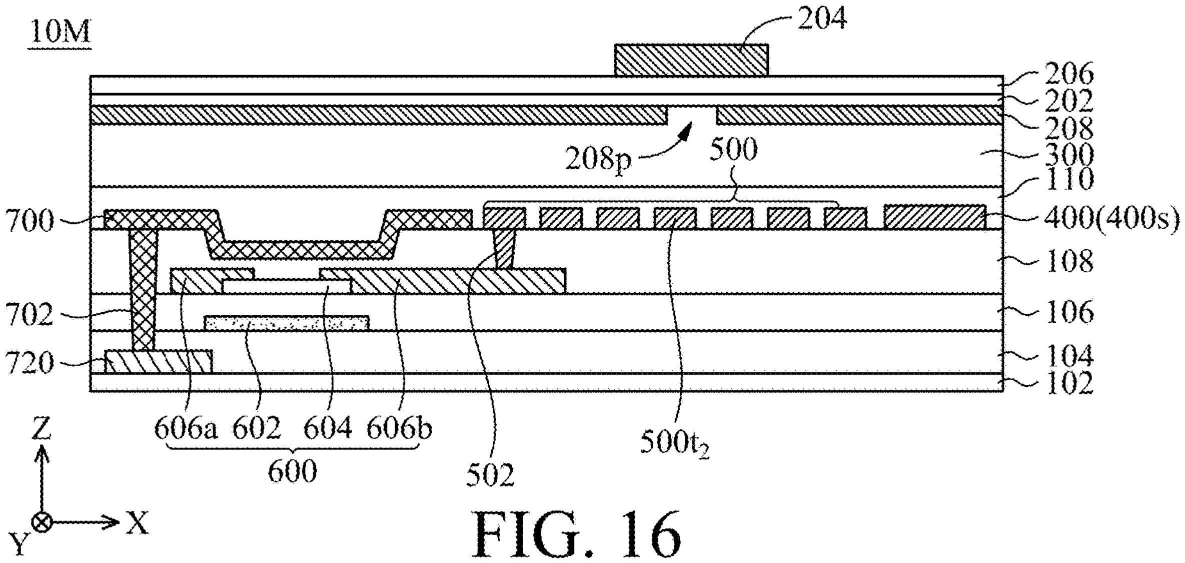
FIG. 16 is a cross-sectional diagram of an electronic device in accordance with some embodiments of the present disclosure.

Next, refer to FIG. 16, which is a cross-sectional diagram of an electronic device 10M in accordance with some embodiments of the present disclosure. The electronic device 10M shown in FIG. 16 is substantially similar to the electronic device 10A shown in FIG. 1C. The difference between them includes that the electronic device 10M further includes a barrier layer 700, and the barrier layer 700 may at least partially overlap with the thin film transistor 600.

Specifically, as shown in FIG. 16, the barrier layer 700 may be disposed on the second insulating layer 108 and the barrier layer 700 may overlap with the active layer 604 of the thin film transistor 600 in a normal direction of the first substrate 102 (for example, the Z direction shown in the figure). In addition, in this embodiment, the barrier layer 700 may be electrically connected to the fourth conductive layer 720 with a constant potential through a via 702. In this embodiment, the fourth conductive layer 720 may be disposed on the first substrate 102. In another embodiment, the fourth conductive layer 720 may be disposed on the buffer layer 104 or first insulating layer 106, but it is not limited thereto. In this embodiment, the via 702 may extend from the top surface of the second insulating layer 108 through the first insulating layer 106 and the buffer layer 104 to the top surface of the fourth conductive layer 720. Moreover, in this embodiment, in the normal direction of the first substrate 102, the barrier layer 700 may not overlap with the patch element 204.

In some embodiments, the material of the barrier layer 700, the via 702, and the fourth conductive layer 720 may include a metal conductive material, a transparent conductive material, or a combination thereof. The metal conductive material may include copper (Cu), silver (Ag), tin (Sn), aluminum (Al), molybdenum (Mo), tungsten (W), gold (Au), chromium (Cr), nickel (Ni), platinum (Pt), titanium (Ti), copper alloy, silver alloy, tin alloy, aluminum alloy, molybdenum alloy, tungsten alloy, gold alloy, chromium alloy, nickel alloy, platinum alloy, titanium alloy, other suitable conductive materials, or a combination thereof, but it is not limited thereto. The transparent conductive material may include a transparent conductive oxide (TCO). For example, the transparent conductive oxide may include indium tin oxide (ITO), tin oxide (SnO), zinc oxide (ZnO), indium zinc oxide (IZO), indium gallium zinc oxide (IGZO), indium tin zinc oxide (ITZO), antimony tin oxide (ATO), antimony zinc oxide (AZO), or a combination thereof, but it is not limited thereto. In addition, the materials of the barrier layer 700, the via 702, and the fourth conductive layer 720 may be the same or different from each other.

In accordance with some embodiments, the potential of the barrier layer 700 that is electrically connected to the fourth conductive layer 720 may be the same as that of the patch element 204, thereby reducing risk of generating coupling capacitors of non-grounded metal wires on the first substrate 102.

Figure 17:
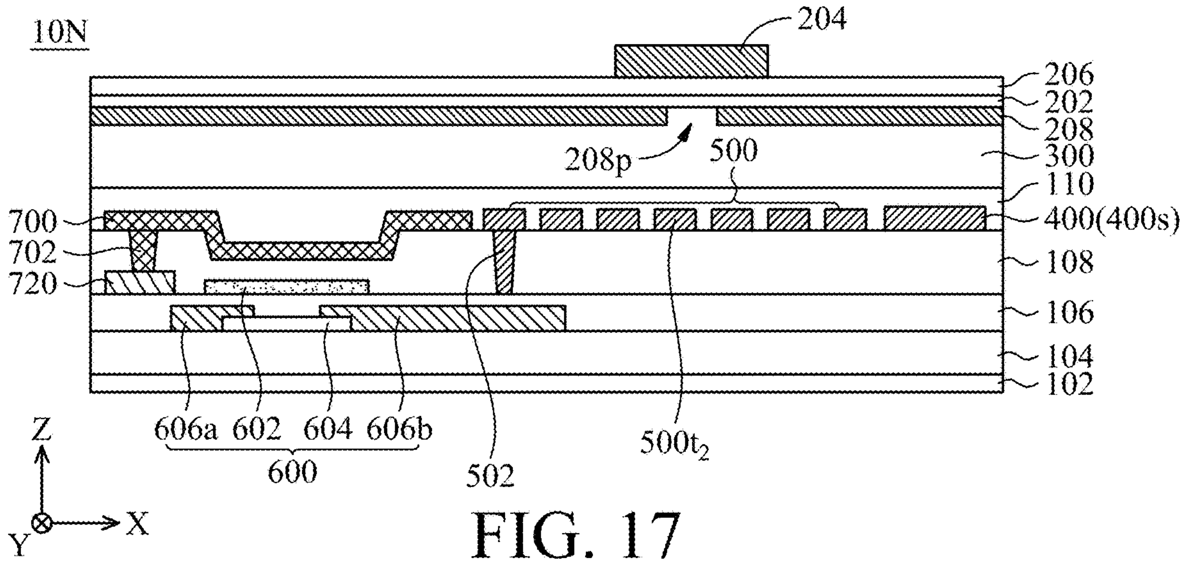
FIG. 17 is a cross-sectional diagram of an electronic device in accordance with some embodiments of the present disclosure.

Next, refer to FIG. 17, which is a cross-sectional diagram of an electronic device 10N in accordance with some embodiments of the present disclosure. The electronic device 10N shown in FIG. 17 is substantially similar to the electronic device 10M shown in FIG. 16. The difference between them includes that the fourth conductive layer 720 is disposed on the first insulating layer 106 in the electronic device 10N. In this embodiment, the via 702 may extend from the top surface of the second insulating layer 108 through a portion of the second insulating layer 108 to the top surface of the fourth conductive layer 720.

Figure 18A:
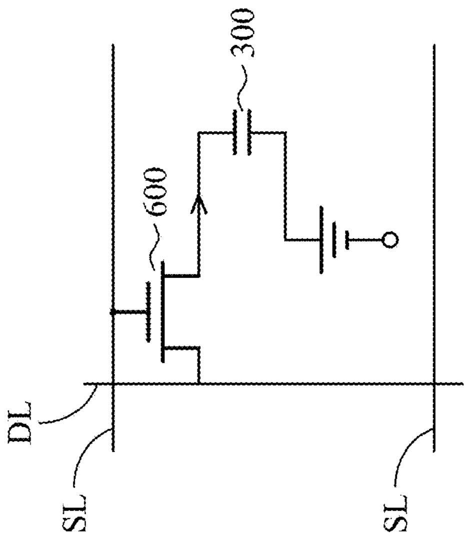
FIGS. 18A-18D are diagrams of circuit units of an electronic device in accordance with some embodiments of the present disclosure.

Next, refer to FIGS. 18A-18D, which are diagrams of circuit units of the modulation unit 100A of the electronic device in accordance with some embodiments of the present disclosure. As shown in FIG. 18A, in some embodiments, the modulation unit 100A may include the thin film transistor 600, and the thin film transistor 600 may be electrically connected to the scan line SL and the data line, and the thin film transistor 600 may be used to control the liquid crystal layer 300.

Figure 18B:
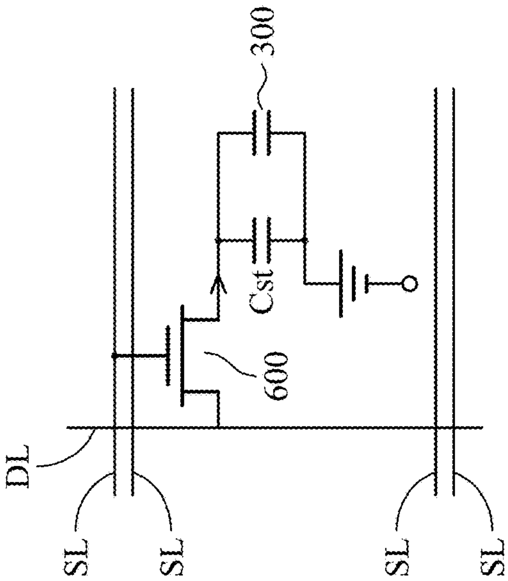

As shown in FIG. 18B, in some embodiments, the modulation unit 100A may further include a storage capacitor Cst that is electrically connected to the thin film transistor 600, and the storage capacitor Cst may be used to maintain a voltage.

Figure 18C:
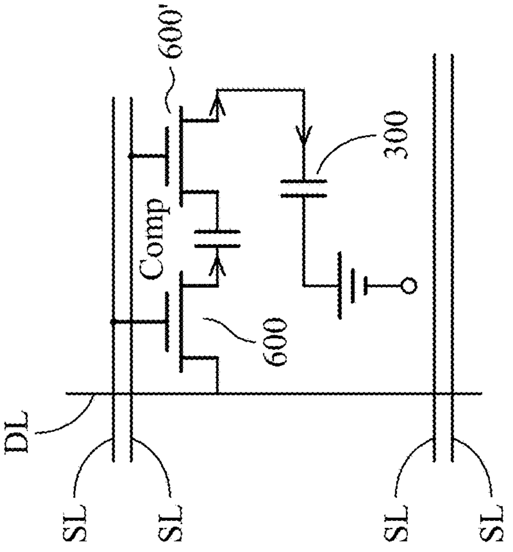
Figure 18D:
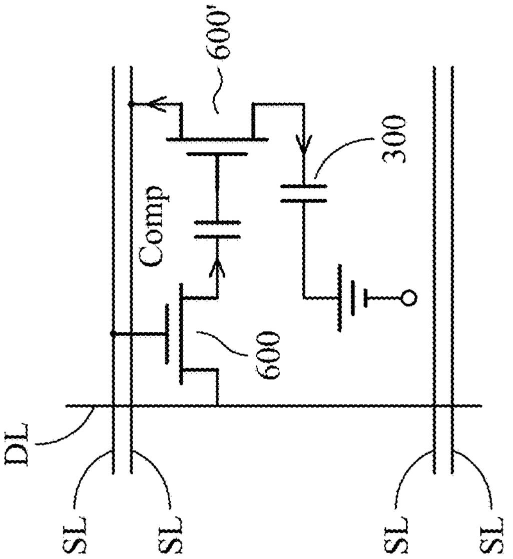

Furthermore, as shown in FIGS. 18C and 18D, in some embodiments, the modulation unit 100A may further include another thin film transistor 600'. Specifically, the phase shifter electrode 500 may be further electrically connected with another thin film transistor 600'. In one embodiment, in the electronic device, a quantity of the thin film transistors is greater than or equal to a quantity of the plurality of phase shifter electrodes, but it is not limited thereto. In another embodiment, in one modulation unit 100A, a quantity of the thin film transistor is greater than or equal to a quantity of the plurality of phase shifter electrodes, but not limited thereto. For example, one phase shifter electrode 500 may only electrically connected to one thin film transistor (e.g. the thin film transistor 600), or one phase shifter electrode 500 may electrically connected to at least two thin film transistors (e.g. the thin film transistors 600 and 600'), but it is not limited thereto. In yet another embodiment, among the thin film transistor(s) and the phase shifter electrode(s) that electrically connected to the thin film transistor(s), a quantity of the thin film transistor is greater than or equal to a quantity of the plurality of phase shifter electrodes, but it is not limited thereto. In some embodiments, the thin film transistor 600 and the thin film transistor 600' may be used as a driving element or a switching element. In some embodiments, the thin film transistor 600 and the thin film transistor 600' may be coupled to a compensation capacitor Comp to compensate the voltage of the phase shifter electrode 500 to improve the voltage stabilization or charging performance.

To summarize the above, in accordance with some embodiments of the present disclosure, the electronic device that is provided includes the phase shifter electrode electrically connected to the thin film transistor. Compared with the phase shifter electrode array that is controlled using a passive driving element (for example, integrated circuits and digital analog converters), the electronic device provided in the present disclosure can improve the problem of circuits coupling or short circuits that may be caused by insufficient wiring space, or reduce the complexity of the circuit or the power consumption of the electronic device. In accordance with some embodiments, the problem of receiving inconsistent feeding voltages among different phase shifter electrodes can be improved by using phase shifter electrodes that are each electrically connected to the active driving element.

Although some embodiments of the present disclosure and their advantages have been described in detail, it should be understood that various changes, substitutions and alterations can be made herein without departing from the spirit and scope of the disclosure as defined by the appended claims. The features of the various embodiments can be used in any combination as long as they do not depart from the spirit and scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes an individual embodiment, and the claimed scope of the present disclosure also includes the combinations of the claims and embodiments. The scope of protection of present disclosure is subject to the definition of the scope of the appended claims.

What is claimed is:

1. A phase-array antenna comprising a plurality of antenna units arranged in an array, wherein one of the plurality antenna units comprising:
- a substrate;
- a feeding line disposed on the substrate and having a signal transmitting end;
- a conductor disposed on the substrate and having a signal receiving end; and
- an active element disposed on the substrate and comprising an active layer;
- wherein the signal transmitting end of the feeding line is apart from the signal receiving end of the conductor by 0.05 mm to 5 mm, and the active layer is apart from the feeding line by 1 mm to 200 mm.

2. The phase-array antenna as claimed in claim 1, wherein the conductor is electrically connected to the active element.

3. The phase-array antenna as claimed in claim 1, wherein the feeding line is electrically connected to a conductive element through a via.

4. The phase-array antenna as claimed in claim 3, wherein the conductive element has a first thickness, the feeding line has a second thickness, and the first thickness is greater than or equal to the second thickness.

5. The phase-array antenna as claimed in claim 3, wherein the conductivity of the conductive element is greater than or equal to the conductivity of the feeding line.

6. The phase-array antenna as claimed in claim 1, wherein the feeding line and the conductor are disposed on different layers.

7. The phase-array antenna as claimed in claim 1, wherein the active layer is not overlapped with the feeding line in a top-view direction of the phase-array antenna.

8. A phase-array antenna comprising a plurality of antenna units arranged in an array, comprising:
- a substrate;
- a plurality of conductors disposed on the substrate, wherein at least one of the plurality of conductors is for receiving a signal; and
- a plurality of patch elements disposed on the plurality of conductors respectively, wherein a distance between adjacent two of the plurality of patch elements is in a range from 0.1 mm to 300 mm.

9. The phase-array antenna as claimed in claim 8, wherein a minimum distance between one of the plurality of conductors and one of the plurality of patch elements is in a range from 0.1 mm to 300 mm.

* * * * *